(12) United States Patent
Behin-Aein et al.

(10) Patent No.: US 8,558,571 B2
(45) Date of Patent: Oct. 15, 2013

(54) ALL-SPIN LOGIC DEVICES

(75) Inventors: Behtash Behin-Aein, San Jose, CA (US); Srikant Srinivasan, Lafayette, IN (US); Angik Sarkar, West Lafayette, IN (US); Supriyo Datta, West Lafayette, IN (US); Sayeef Salahuddin, Berkeley, CA (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 13/345,588

(22) Filed: Jan. 6, 2012

(65) Prior Publication Data

US 2012/0176154 A1 Jul. 12, 2012

Related U.S. Application Data

(60) Provisional application No. 61/430,248, filed on Jan. 6, 2011.

(51) Int. Cl.
*H03K 19/195* (2006.01)
(52) U.S. Cl.
USPC .................... 326/7; 326/104; 977/940
(58) Field of Classification Search
None
See application file for complete search history.

(56) References Cited

U.S. PATENT DOCUMENTS

| | | | |
|---|---|---|---|
| 8,138,874 B1 * | 3/2012 | Carlton et al. | 335/306 |
| 2011/0095761 A1 * | 4/2011 | Ahn | 324/309 |
| 2011/0140217 A1 * | 6/2011 | Nguyen et al. | 257/421 |
| 2011/0147866 A1 * | 6/2011 | Sun et al. | 257/421 |
| 2012/0154063 A1 * | 6/2012 | Nikonov et al. | 331/94.1 |
| 2012/0267735 A1 * | 10/2012 | Atulasimha et al. | 257/421 |

OTHER PUBLICATIONS

Allwood et al., "Magnetic Domain-Wall Logic," Science, 2005, pp. 1688-1692, vol. 309.
Appelbaum et al., "Electronic Measurement and Control of Spin Transport in Silicon," Nature, May 17, 2007, pp. 295-298, vol. 447.
Atulasimha et al., "Bennett Clocking of Nanomagnetic Logic Using Multiferroic Single-Domain Nanomagnets," Applied Physics Letters, Oct. 26, 2010, pp. 173105-1 to 173105-3, vol. 97.
Bedau et al., "Spin-Transfer Pulse Switching: From the Dynamic to the Thermally Activated Regime," Applied Physics Letters, Dec. 30, 2010, pp. 262502-1 to 262502-3, vol. 97.
Behin-Aein et al., "Switching Energy-Delay of All-Spin Logic Devices," Applied Physics Letters, Mar. 24, 2011, pp. 123510-1 to 123510-3, vol. 98.
Behin-Aein et al., "Switching Energy of Ferromagnetic Logic Bits," IEEE Transactions on Nanotechnology, Jul. 2009, pp. 505-514, vol. 8.
Behin-Aein et al., "Proposal for an All-Spin Logic Device with Built-in Memory," Nature Nanotechnology, Feb. 28, 2010, pp. 266-270, vol. 5.

(Continued)

*Primary Examiner* — Jany Richardson
(74) *Attorney, Agent, or Firm* — Barnes & Thornburg LLP

(57) ABSTRACT

Illustrative embodiments of all-spin logic devices, circuits, and methods are disclosed. In one embodiment, an all-spin logic device may include a first nanomagnet, a second nanomagnet, and a spin-coherent channel extending between the first and second nanomagnets. The spin-coherent channel may be configured to conduct a spin current from the first nanomagnet to the second nanomagnet to determine a state of the second nanomagnet in response to a state of the first nanomagnet.

27 Claims, 19 Drawing Sheets

(56) References Cited

OTHER PUBLICATIONS

Bennett, "The Thermodynamics of Computation—A Review," International Journal of Theoretical Physics, 1982, pp. 905-940, vol. 21.
Berger, "Emission of Spin Waves by a Magnetic Multilayer Traversed by a Current," Physical Review B, Oct. 1, 1996, pp. 9353-9358, vol. 54.
Berkowitz et al., "Exchange Anisotropy—A Review," Journal of Magnetism & Magnetic Materials, 1999, pp. 552-570, vol. 200.
Brataas et al., "Non-Collinear Magnetoelectronics," Physics Reports, Mar. 9, 2006, pp. 157-255, vol. 427.
Brataas et al., "Spin-Battery Operated by Ferromagnetic Resonance," Physical Review B, Aug. 29, 2002, pp. 060404-1 to 060404-4, vol. 66.
Brown, "Thermal Fluctuations of a Single-Domain Particle," Physical Review, Jun. 1, 1963, pp. 1677-1686, vol. 130.
Brown, "Thermal Fluctuations of Fine Ferromagnetic Particles," IEEE Transactions on Magnetics, Sep. 1979, pp. 1196-1208, vol. 15.
Carlton et al., "Simulation Studies of Nanomagnet-Based Logic Architecture," Nano Letters, 2008, pp. 4173-4178, vol. 8.
Casanova et al., "Control of Spin Injection by Direct Current in Lateral Spin Valves," Physical Review B, May 13, 2009, pp. 184415-1 to 184415-6, vol. 79.
Cowburn et al., "Room Temperature Magnetic Quantum Cellular Automata," Science, Feb. 25, 2000, pp. 1466-1468, vol. 287.
Csaba et al., "Nanocomputing by Field-Coupled Nanomagnets," IEEE Transactions on Nanotechnology, Dec. 2002, pp. 209-213, vol. 1.
Csaba et al., "A Computing Architecture Composed of Field-Coupled Single Domain Nanomagnets Clocked by Magnetic Field," International Journal of Circuit Theory & Applications, 2003, pp. 67-82, vol. 31.
Dash et al., "Electrical Creation of Spin Polarization in Silicon at Room Temperature," Nature, Nov. 26, 2009, pp. 817-822, vol. 462.
Deac et al., "Bias-Driven High-Power Microwave Emission from MgO-Based Tunnel Magnetoresistance Devices," Nature Physics, Aug. 10, 2008, pp. 803-809, vol. 4.
Dery et al., "Spin-Based Logic in Semiconductors for Reconfigurable Large-Scale Circuits," Nature, May 31, 2007, pp. 573-576, vol. 447.
Doyle, "Magnetization Reversal in Films with Biaxial Anisotropy," IEEE Transactions on Magnetics, Jun. 1996, pp. 68-73, vol. 2.
Fabian et al., Semiconductor Spintronics, 2007, pp. 1-343.
Gallagher et al., "Development of the Magnetic Tunnel Junction MRAM at IBM," IBM Journal of Research & Development, Jan. 2006, pp. 5-23A, vol. 50.
Garcia-Palacios et al., "Langevin-Dynamics Study of the Dynamical Properties of Small Magnetic Particles," Physical Review B, Dec. 1, 1998, pp. 14937-14958, vol. 58.
Houssameddine et al., "Spin-Torque Oscillator Using a Perpendicular Polarizer and a Planar Free Layer," Nature Materials, Apr. 29, 2007, pp. 447-453 vol. 6.
Huang et al., "Coherent Spin Transport Through a 350 Micron Thick Silicon Wafer," Physical Review Letters, Oct. 26, 2007, pp. 177209-1 to 177209-4, vol. 99.
Huang et al., "Geometric Dephasing-Limited Hanle Effect in Long-Distance Lateral Silicon Spin Transport Devices," Applied Physics Letters, Oct. 23, 2008, pp. 162508-1 to 162508-3, vol. 93.
Huang et al., "Spin Dephasing in Drift-Dominated Semiconductor Spintronics Devices," Physical Review B, Apr. 22, 2008, pp. 165331-1 to 165331-6, vol. 77.
Imre et al., "Majority Logic Gate for Magnetic Quantum-Dot Cellular Automata," Science, Jan. 13, 2006, pp. 205-208, vol. 311.
Jang et al., "Non-Ohmic Spin Transport in N-Type Doped Silicon," Physical Review B, Oct. 29, 2008, pp. 165329-1 to 165329-6, vol. 78.
Jedeema et al., "Electrical Detection of Spin Precession in a Metallic Mesoscopic Spin Valve," Nature, Apr. 18, 2002, pp. 713-716, vol. 416.

Jedeema et al., "Electrical Spin Injection and Accumulation at Room Temperature in an All-Metal Mesoscopic Spin Valve," Nature, Mar. 15, 2001, pp. 345-348, vol. 410.
Jedeema et al., "Spin Injection and Spin Accumulation in All-Metal Mesoscopic Spin Valves," Physical Review B, Feb. 28, 2003, pp. 085319-1 to 085319-16, vol. 67.
Jeon et al., "Control of the Magnetic Anisotropy of a Co/Pt Nanomultilayer with Embedded Particles," Advanced Materials, Aug. 16, 2002, pp. 1116-1120, vol. 14.
Johnson et al., "Thermodynamic Analysis of Interfacial Transport and of the Thermomagnetoelecric System," Physical Review B, Apr. 1, 1987, pp. 4959-4972, vol. 35.
Johnson et al., "Interfacial Charge-Spin Coupling: Injection and Detection of Spin Magnetization in Metals," Physical Review Letters, Oct. 21, 1985, pp. 1790-1793, vol. 55.
Jonker et al., "Electrical Spin-Injection into Silicon from a Ferromagnetic Metal/Tunnel Barrier Contact," Nature Physics, Jul. 15, 2007, pp. 542-546, vol. 3.
Kent et al., "Spin-Transfer-Induced Precessional Magnetization Reversal," Applied Physics Letters, Apr. 29, 2004, pp. 3897-3899, vol. 84.
Khitun et al., "Spin Wave Logic Circuit on Silicon Platform," Fifth International Conference on Information Technology, 2008, pp. 1107-1110.
Kimura et al., "Temperature Evolution of Spin Relaxation in a NiFe/Cu Lateral Spin Valve," Physical Review Letters, Feb. 13, 2008, pp. 066602-1 to 066602-4, vol. 100.
Krivorotov et al., "Time-Domain Measurements of Nanomagnet Dynamics Driven by Spin-Transfer Torques," Science, Jan. 14, 2005, pp. 228-231, vol. 307.
Kubota et al., "Quantitative Measurement of Voltage Dependence of Spin-Transfer Torque in MgO-Based Magnetic Tunnel Junctions," Nature Physics, Nov. 25, 2007, pp. 37-41, vol. 4.
Kummamuru et al., "Operation of a Quantum-Dot Cellular Automata Shift Register and Analysis of Errors," IEEE Transactions on Electron Devices, Sep. 2003, pp. 1906-1913, vol. 50.
Lee et al., "Ultrafast Switching of a Nanomagnet by a Combined Out-of-Plane and In-Plane Polarized Spin Current Pulse," Applied Physics Letters, Jul. 8, 2009, pp. 012506-1 to 012506-3, vol. 95.
Leem et al., "Magnetic Coupled Spin-Torque Devices and Magnetic Ring Oscillator," Proceedings of the IEEE International Electron Devices Meeting, Dec. 2008, pp. 1-4.
Likharev et al., "Single-Electron Parametron: Reversible Computation in a Discrete-State System," Science, Aug. 9, 1996, pp. 763-765, vol. 273.
Liu et al., "Reduction of the Spin-Torque Critical Current by Partially Canceling the Free Layer Demagnetization Field," Applied Physics Letters, Mar. 26, 2009, pp. 122508-1 to 122508-3, vol. 94.
Lou et al., "Electrical Detection of Spin Transport in Lateral Ferromagnet-Semiconductor Devices," Nature Physics, Feb. 25, 2007, pp. 197-202, vol. 3.
Mangin et al., "Current-Induced Magnetization Reversal in Nanopillars with Perpendicular Anisotropy," Nature Materials, Feb. 19, 2006, pp. 210-215, vol. 5.
Mangin et al., "Reducing the Critical Current for Spin-Transfer Switching of Perpendicularly Magnetized Nanomagnets," Applied Physics Letters, Jan. 6, 2009, pp. 012502-1 to 012502-3, vol. 94.
Meng et al., "Spin Transfer in Nanomagnetic Devices with Perpendicular Anisotropy," Applied Physics Letters, Apr. 26, 2006, pp. 172506-1 to 172506-3, vol. 88.
Min et al., "Tunable Spin-Tunnel Contacts to Silicon Using Low Work-Function Ferromagnets," Nature Materials, Sep. 17, 2006, pp. 817-822, vol. 5.
Ney et al., "Programmable Computing with a Single Magnetoresistive Element," Nature, Oct. 2, 2003, pp. 485-487, vol. 425.
Nikonov et al., "Power Dissipation in Spintronic Devices Out of Thermodynamic Equilibrium," Journal of Superconductivity & Novel Magnetism, Dec. 14, 2006, pp. 497-513, vol. 19.
Nikonov et al., "Simulation of Highly Idealized, Atomic Scale Magnetic Quantum Cellular Automata Logic Circuits," Mar. 2008, pp. 1-34.

(56) References Cited

OTHER PUBLICATIONS

Papusoi et al., "100 ps Precessional Spin-Transfer Switching of a Planar Magnetic Random Access Memory Cell with Perpendicular Spin Polarizer," Applied Physics Letters, Aug. 20, 2009, pp. 072506-1 to 072506-3, vol. 95.

Petit et al., "Spin-Torque Influence on the High-Frequency Magnetization Fluctuations in Magnetic Tunnel Junctions," Physical Review Letters, Feb. 12, 2007, pp. 077203-1 to 077203-4, vol. 98.

Ralph et al., "Spin Transfer Torques," Journal of Magnetism & Magnetic Materials, Dec. 28, 2007, pp. 1190-1216, vol. 320.

Rashba, "Theory of Electrical Spin Injection: Tunnel Contacts as a Solution of the Conductivity Mismatch Problem," Physical Review B, Dec. 15, 2000, pp. R16267-R16270, vol. 62.

Salahuddin et al., "Interacting Systems for Self Correcting Low Power Switching," Applied Physics Letters, Feb. 27, 2007, pp. 093503-1 to 093503-3, vol. 90.

Sankey et al., "Measurement of the Spin-Transfer-Torque Vector in Magnetic Tunnel Junctions," Nature Physics, Nov. 25, 2007, pp. 67-71, vol. 4.

Schmidt et al., "Fundamental Obstacle for Electrical Spin Injection from a Ferromagnetic Metal into a Diffusive Semiconductor," Physical Review B, Aug. 15, 2000, pp. R4790-R4793, vol. 62.

Shiraishi, "Spin Transport in Single- and Multi-Layer Graphene," Proceedings of the IEEE International Electron Devices Meeting, 2009, pp. 249-252.

Slonczewski, "Current-Driven Excitation of Magnetic Multilayers," Journal of Magnetism & Magnetic Materials, 1996, pp. L1-L7, vol. 159.

Srinivasan et al., "Unidirectional Information Transfer with Cascaded All Spin Logic Devices: A Ring Oscillator," Proceedings of the IEEE Device Research Conference, Jun. 2011, pp. 161-162.

Srinivasan et al., "All-Spin Logic Device with Inbuilt Nonreciprocity," IEEE Transactions on Magnetics, Oct. 2011, pp. 4026-4032, vol. 47.

Sun et al., "A Three-Terminal Spin-Torque-Driven Magnetic Switch," Applied Physics Letters, Aug. 28, 2009, pp. 083506-1 to 083506-3, vol. 95.

Sun et al., "Magnetoresistance and Spin-Transfer Torque in Magnetic Tunnel Junctions," Journal of Magnetism & Magnetic Materials, Jan. 14, 2008, pp. 1227-1237, vol. 320.

Sun et al., "Monodisperse FePt Nanoparticles and Ferromagnetic FePt Nanocrystal Superlattices," Science, Mar. 17, 2000, pp. 1989-1992, vol. 287.

Sun, "Spin Angular Momentum Transfer in Current-Perpendicular Nanomagnetic Junctions," IBM Journal of Research & Development, Jan. 2006, pp. 81-100, vol. 50.

Sun, "Spin-Current Interaction with a Monodomain Magnetic Body: A Model Study," Physical Review B, Jul. 1, 2000, pp. 570-578, vol. 62.

Takahashi et al., "Spin Injection and Detection in Magnetic Nanostructures," Physical Review B, Feb. 28, 2003, pp. 052409-1 to 052409-4, vol. 67.

Theis et al., "It's Time to Reinvent the Transistor!," Science, Mar. 26, 2010, pp. 1600-1601, vol. 327.

Tombros et al., "Electronic Spin Transport and Spin Precession in Single Graphene Layers at Room Temperature," Nature, Aug. 2, 2007, pp. 571-575, vol. 448.

Tsoi et al., "Excitation of a Magnetic Multilayer by an Electric Current," Physical Review Letters, May 11, 1998, pp. 4281-4284, vol. 80.

Valet et al., "Theory of the Perpendicular Magnetoresistance in Magnetic Multilayers," Physical Review B, Sep. 1, 1993, pp. 7099-7113, vol. 48.

Wang et al., "A 180-mV Subthreshold FFT Processor Using a Minimum Energy Design Methodology," IEEE Journal of Solid-State Circuits, Jan. 2005, pp. 310-319, vol. 40.

Weller et al., "High $K_u$ Materials Approach to 100 Gbits/in$^2$," IEEE Transactions on Magnetics, Jan. 2000, pp. 10-15, vol. 36.

Wolf et al., "Spintronics: A Spin-Based Electronics Vision for the Future," Science, Nov. 16, 2001, pp. 1488-1495, vol. 294.

Xia et al., "Spin Torques in Ferromagnetic/Normal-Metal Structures," Physical Review B, May 23, 2002, pp. 220401-1 to 220401-4, vol. 65.

Xioahua et al., "Electrical Detection of Spin Transport in Lateral Ferromagnet-Semiconductor Devices," Nature Physics, Feb. 25, 2007, pp. 197-202, vol. 3.

Xu et al., "An All-Metallic Logic Gate Based on Current-Driven Domain Wall Motion," Nature Nanotechnology, Feb. 3, 2008, pp. 97-100, vol. 3.

Yang et al., "Giant Spin-Accumulation Signal and Pure Spin-Current-Induced Reversible Magnetization Switching, Nature Physics," Oct. 5, 2008, pp. 851-854, vol. 4.

Yoda et al., "High Efficient Spin Transfer Torque Writing on Perpendicular Magnetic Tunnel Junctions for High Density MRAMs," Current Applied Physics, Dec. 16, 2009, pp. e87-e89, vol. 10.

Zhang et al., "Mechanisms of Spin-Polarized Current-Driven Magnetization Switching," Physical Review Letters, Jun. 10, 2002, pp. 236601-1 to 236601-4, vol. 88.

* cited by examiner

| $V_{SS}>0$ (NOT) | $V_{SS}<0$ (COPY) |
|---|---|
| 01 ↻ 11 | 01  11 |
| ↑  ↓ | ↓  ↑ |
| 00  ↺10 | 00↺  10 |

ALL-SPIN LOGIC DEVICES

CROSS-REFERENCE TO RELATED APPLICATIONS

This application claims priority under 35 U.S.C. §119(e) to U.S. Provisional Patent Application Ser. No. 61/430,248, filed on Jan. 6, 2011, and entitled "All-Spin Transistor with Built-In Memory," the entire disclosure of which is expressly incorporated herein by reference.

STATEMENT REGARDING FEDERALLY SPONSORED RESEARCH

This invention was made with government support under Grant Nos. EEC0228390 and EEC0738513, both awarded by the National Science Foundation. The U.S. Government has certain rights in the invention.

BACKGROUND

The present disclosure relates generally to All-Spin Logic Devices from which all-spin architectures may be constructed. The possible role of spin as an alternative to charge for logic applications has been recognized. Most spin-based proposals, however, use spin only as an internal variable (i.e., the terminal quantities of each individual logic gate are still charge-based). It has also been pointed out that collective entities like magnets may require significantly less switching energy than an equivalent number of non-interacting spins. Recently, there has been significant experimental progress in implementing different forms of magnet-based switching circuits. For instance, in the Magnetic Quantum Cellular Automata (MQCA) architecture, each magnet controls the switching of a neighboring magnet through its magnetic field. In MQCA circuits, interconnects are made of an array of magnets, which also require clocking by external magnetic fields. This scheme is not well-suited for general purpose computing due to the limited control over the nearest-neighbor interconnections.

SUMMARY

According to one aspect, an all-spin logic device may comprise a first nanomagnet, a second nanomagnet, and a spin-coherent channel extending between the first and second nanomagnets. The spin-coherent channel may be configured to conduct a spin current from the first nanomagnet to the second nanomagnet to determine a state of the second nanomagnet in response to a state of the first nanomagnet.

In some embodiments, the first and second nanomagnets may have identical switching characteristics. The all-spin logic device may further comprise a tunnel barrier disposed at an interface between the spin-coherent channel and one of the first and second nanomagnets. The second nanomagnet may comprise a free layer having an easy axis and a fixed layer having an easy axis, where the easy axis of the fixed layer is perpendicular to the easy axis of the free layer.

In other embodiments, the first and second nanomagnets may each be electrically coupled to one un-clocked supply voltage. The second nanomagnet may have a greater spin-torque conductance relative to the spin-coherent channel than the first nanomagnet. The spin-coherent channel may comprise a ground terminal positioned closer to the first nanomagnet than to the second nanomagnet.

In still other embodiments, second nanomagnet may be electrically coupled to a floating voltage. Alternatively, the second nanomagnet may be grounded. The first and second nanomagnets may each have an energy barrier of at least one-quarter electron-volt and may each comprise less than $10^6$ Bohr magnetons.

According to another aspect, an all-spin logic circuit may comprise a first nanomagnet having an input side and an output side, a second nanomagnet having an input side and an output side, a third nanomagnet having an input side and an output side, a first spin-coherent channel configured to conduct a spin current generated from the input side of the first nanomagnet to the output side of the second nanomagnet, and a second spin-coherent channel configured to conduct a spin current generated from the input side of the second nanomagnet to the output side of the third nanomagnet.

In some embodiments, the first, second, and third nanomagnets may have identical switching characteristics. The all-spin logic circuit may further comprise a third spin-coherent channel configured to conduct a spin current generated from the input side of the third nanomagnet to the output side of the first nanomagnet. The output sides of the first, second, and third nanomagnets each have a greater spin-torque conductance than the input sides of the first, second, and third nanomagnets.

In other embodiments, the first spin-coherent channel may comprise a ground terminal positioned closer to the input side of the first nanomagnet than to the output side of the second nanomagnet, and the second spin-coherent channel may comprise a ground terminal positioned closer to the input side of the second nanomagnet than to the output side of the third nanomagnet. The first and second spin-coherent channels may be separated by an isolation layer. The first, second, and third nanomagnets may each be electrically coupled to one unclocked supply voltage.

According to yet another aspect, a method may comprise applying a voltage to a first nanomagnet to generate a first spin current in response to a magnetization direction of the first nanomagnet and routing the first spin current along a first spin-coherent channel to a second nanomagnet to determine a magnetization direction of the second nanomagnet.

In some embodiments, the magnetization direction of the second nanomagnet does not determine the magnetization direction of the first nanomagnet. The method may further comprise applying a voltage to a third nanomagnet to generate a second spin current in response to a magnetization direction of the third nanomagnet and routing the second spin current along the first spin-coherent channel to the second nanomagnet to determine the magnetization direction of the second nanomagnet in response to a superposition of the first and second spin currents.

In other embodiments, the method may further comprise applying a voltage to the second nanomagnet to generate a second spin current in response to the magnetization direction of the second nanomagnet and routing the second spin current along a second spin-coherent channel to a third nanomagnet to determine a magnetization direction of the third nanomagnet. The method may also comprise applying a voltage to the third nanomagnet to generate a third spin current in response to the magnetization direction of the third nanomagnet and routing the third spin current along a third spin-coherent channel to the first nanomagnet to determine the magnetization direction of the first nanomagnet. Applying a voltage to the first nanomagnet and applying a voltage to the second nanomagnet may comprise applying one un-clocked supply voltage to both the first and second nanomagnets.

In still other embodiments, the method may further comprise applying a clocked supply voltage to a fixed layer of the second nanomagnet to place a free layer of the second nanomagnet in a neutral state while receiving the first spin current from the first spin-coherent channel. The method may further comprise applying a floating voltage to the second nanomagnet while receiving the first spin current from the first spin-coherent channel. The method may further comprise grounding the second nanomagnet while receiving the first spin current from the first spin-coherent channel. The magnetization direction of the second nanomagnet may oscillate with the magnetization direction of the first nanomagnet.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION OF THE DRAWINGS

Figure 1:
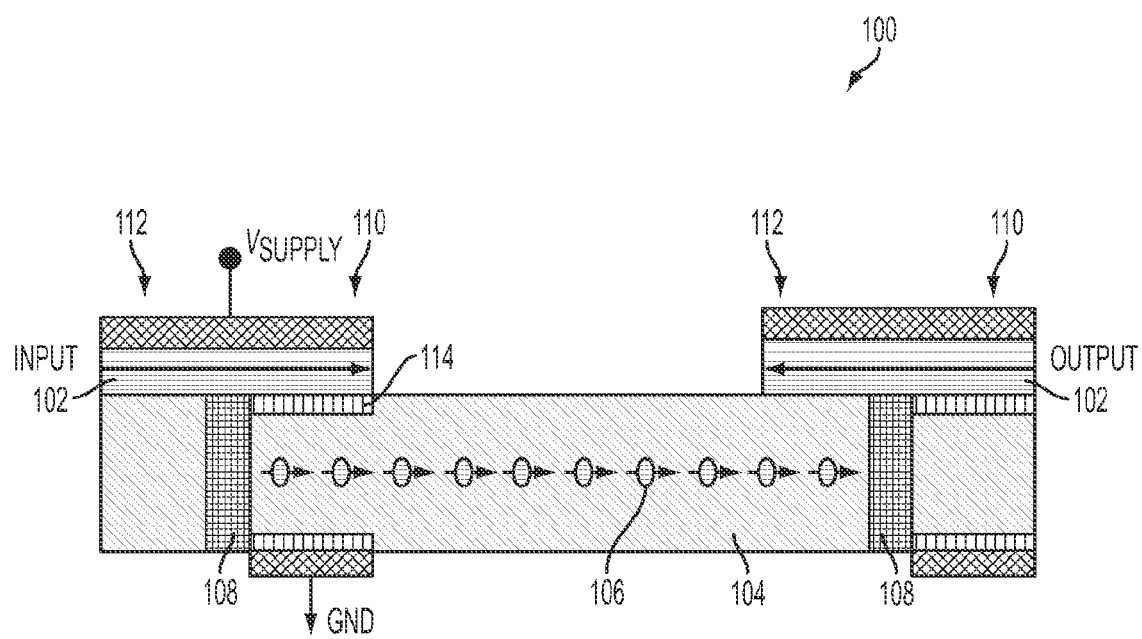
FIG. 1A illustrates one embodiment of an all-spin logic device (ASLD).

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives consistent with the present disclosure and appended claims.

References in the specification to "one embodiment," "an embodiment," "an example embodiment," etcetera, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The present disclosure relates to All-Spin Logic Devices (ASLD) comprising a number of nanomagnets linked by a number of spin-coherent channels. The nanomagnets of the ASLD may be switched between their stable states representing binary data (e.g., right-magnetized or left-magnetized in FIGS. 1, 2, 3C, 6A-C, 7A, 10A, 11A, and 13A) if enough torque is exerted on them. Information stored in the magnetization direction of an input nanomagnet may be used to generate a spin current that can be routed along a spin-coherent channel to any desired location, where the spin current determines the final state of an output nanomagnet based on spin-torque phenomenon. Overall, what is achieved is the switching of the output nanomagnet in accordance with the information provided by the input nanomagnet through a spin current transmitted along the spin-coherent channel.

The presently disclosed ASLD may operate without the use of conventional charge current, even at its terminals. The nanomagnets act as digital spin capacitors that also provide non-volatile memory. The ASLD exhibits the five essential characteristics required for logic applications. First, both input and output information in the ASLD are in the same form, namely magnetization, providing concatenability. Second, the nanomagnets of the ASLD are intrinsically nonlinear (as further described below with reference to FIGS. 3A-F and 4A) and automatically correct any errors in magnetization direction. Third, the resulting input-output transfer characteristics are sharp with large gain (as further described below with reference to FIG. 4B). Fourth, the ASLD may be used to build a complete set of Boolean logic gates (as further described below with reference to FIGS. 6A-C). Fifth, the ASLD exhibits non-reciprocal information transfer from the input magnet to the output magnet. Several methods of minimizing feedback from the output magnet to the input magnet to achieve this non-reciprocity are contemplated, as will be further described below. Thus, architectures employing the ASLD afford versatility comparable to standard charge-based architectures while having the potential for low power operation and continued scaling.

Unlike known MQCA circuits, which use magnetic fields, the ASLD uses spin currents, which may lead to significant increases in both scalability and versatility. As spin currents are not limited to nearest neighbor communication, the ASLD will not be inherently limited to cellular architectures. Instead, the range of communication is limited to a spin diffusion length. At room temperature, using a silicon diffusion constant of $D=36\ cm^2/second$ and a lifetime of 10 nanoseconds, the spin diffusion length would be approximately 6 microns. Drift in an electric field may be used to increase the diffusion length. The range of a few microns is large enough to allow considerable flexibility and versatility of architecture. Moreover, information is transferred in an ASLD with Fermi velocity, which may be compared to magnon velocity, as in the case of MQCA devices. In some embodiments, larger interconnects (e.g., a few millimeters) in an ASLD-based system could be electrical, current-based interconnects. Thus, an entire circuit may comprise blocks of all-spin logic, which may be connected by electrical interconnects, if necessary.

As compared to conventional CMOS devices, the ASLD has the potential for extremely low switching energies (i.e., the energy dissipated throughout switching). The self-correcting feature provided by magnets may make it possible to reduce the switching energy to several $k_BT$ (where T is the room temperature) per magnet rather than several $k_BT$ per spin. Although the ASLD is based on the physics of spin-torque, it does not require the use of structures or phenomena commonly associated with spin-torque, such as the tunneling magneto-resistance (TMR) of high resistance tunnel junctions. The dissipation in existing spin-torque devices is far in excess of the theoretical minimum. Power dissipation, along with other factors that affect scaling of the ASLD, are discussed in more detail below.

Referring now to FIG. 1, one illustrative embodiment of an ASLD 100 includes first and second nanomagnets 102 and a spin-coherent channel 104. As noted above, binary data is stored in a non-volatile manner in the state (i.e., magnetization direction) of each of the nanomagnets 102. The spin-coherent channel 104 extending between the nanomagnets 102 may comprise a metal or a semiconductor, with the latter having a higher spin coherence length. In the illustrative embodiment of FIG. 1, the left nanomagnet 102 acts as an input and the right nanomagnet 102 acts as an output. When a supply voltage is applied, the input magnet 102 generates a spin-current 106 that is routed along the spin-coherent channel 104 to the output magnet 102 to determine the state of the output magnet 102 by spin-torque phenomena. One advantage of the ASLD 100 is that, in some embodiments, the first and second nanomagnets 102 may have identical switching characteristics (i.e., the nanomagnets 102 would both switch if subjected to the same spin-transfer torque) and, hence, may be identical structures.

The ASLD 100 may also include one or more isolation layers 108 that separate the spin-coherent channel 104 from other spin-coherent channels in the architecture, preventing unwanted cross-talk between the channels. The isolation layers 108 may be comprise electrostatic barriers (e.g., oppositely doped semiconductor) and/or insulation layers (e.g., an oxide). Where an isolation layer 108 is placed under a nanomagnet 102, the nanomagnet 102 may interface with two (or more) spin-coherent channels 104. As such, each nanomagnet 102 may have an input side 110 (i.e., a "talking" side) that transmits information via spin currents 106 and an output side 112 (i.e., a "listening" side) that receives information via spin currents 106, providing non-reciprocity.

In some embodiments, the ASLD 100 may further include a tunnel barrier 114 at the interface between the input side 110 of each nanomagnet 102 and the spin-coherent channel 104 to the increase spin injection efficiency (while an ohmic contact at the interface between the output side 112 of each nanomagnet 102 and the spin-coherent channel 104 prevents back-injection of spins). The tunnel barriers 114 may comprise oxides and/or Schottky barriers. In other embodiments, the tunnel barriers 114 may be disposed in other portions of the spin-coherent channel 104. It will be appreciated that, while the tunnel barriers 114 may be included in any embodiment of the presently disclosed ASLD to increase spin injection efficiency, the tunnel barriers 114 need not be included in every embodiment.

Figure 2:
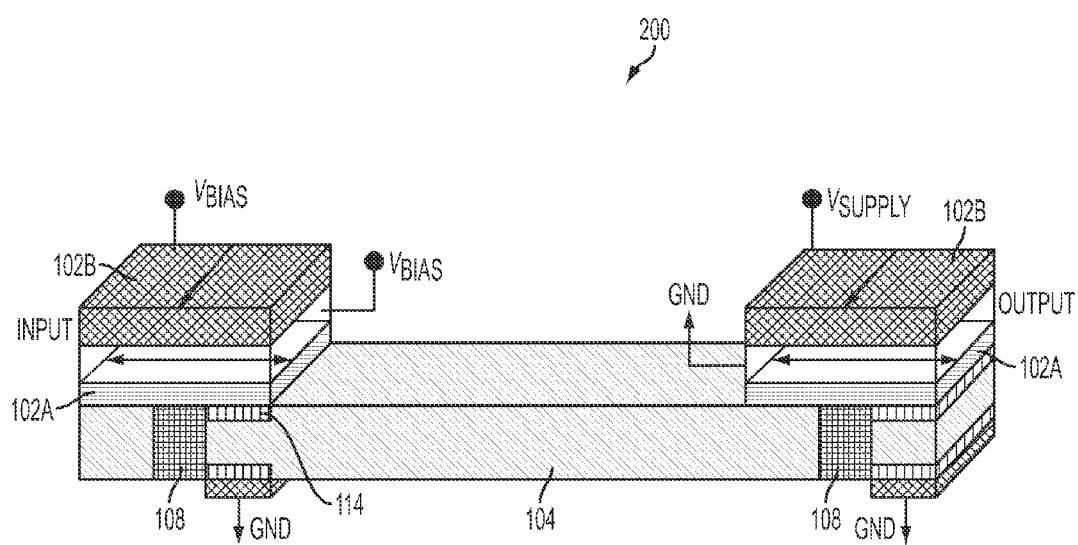
FIG. 2 illustrates another embodiment of an ASLD in which each nanomagnet includes a free layer and a fixed layer with perpendicular easy axes.

Referring now to FIG. 2, another illustrative embodiment of an ASLD 200 is shown. The ASLD 200 of FIG. 2 has a similar configuration to the ASLD 100 of FIG. 1, except that the first and second nanomagnets 102 each comprise a free layer 102A and a fixed layer 102B with perpendicular easy axes (while the easy planes of the two layers 102A-B are aligned in parallel). The magnetization direction of the free layer 102A represents the binary data stored in each nanomagnet 102. In some embodiments of the ASLD 200, the free layer 102A of a bistable nanomagnet 102 may have an energy landscape similar to that shown in FIG. 3A, in which the two stable states A and C represent binary data. State B of the free layer 102 is a high energy "neutral" state. When the free layer 102A is not under the influence of an external torque, the internal field of the bistable nanomagnet 102 drives its magnetization direction to one of the energy minima, i.e., state A or state C.

The fixed layer 102B may be used to place the magnetization direction of the free layer 102A in a neutral state (e.g., state B of FIG. 3A), ready to receive information via a spin current 106 (when an appropriate supply voltage is applied to the fixed layer 102B, as described further below). Thus, in the ASLD 200, the energy required to switch the output magnet 102 is provided by the supply voltage, and only information is conveyed by the spin current 106. In some embodiments, the fixed layer 102B may comprise a pair of anti-parallel layers, so that the dipolar field of fixed layer 102B does not interfere with the switching process. In other embodiments, the nanomagnets 102 of the ASLD 200 may be implemented using known materials with perpendicular magnetic anisotropy (PMA). Structures which utilize materials with PMA and a planar fixed layer may be used to diminish the effect of the demagnetizing field, which increases the minimum switching current density. Simulations of the ASLD 200 suggest that the amplitude of the Slonczewski term (represented on the horizontal axis of FIG. 5B, discussed below) would be considerably lower if the effect of the demagnetizing field was diminished.

The ASLD 200 illustrated in FIG. 2 has been simulated using the a model based on the Landau-Lifshitz-Gilbert (LLG) equation, appropriately modified to include the established physics of the interactions of nanomagnets with spin-polarized currents (i.e., spin-torque). While large magnets have multiple domains, nanomagnets with sizes less than 100 nm in each dimension may be approximated as a single domain having a macro-spin whose dynamics are commonly modeled using the LLG equation (where $\hat{m}$ is the normalized magnetic moment):

$$\frac{d\hat{m}}{dt} = -|\gamma|\hat{m} \times \vec{H}_{eff} + \alpha\hat{m} \times \frac{d\hat{m}}{dt}. \quad (1)$$

$H_{eff}$ is a conservative field that includes all internal and external fields and can be written as the gradient of the potential energy with respect to the normalized magnetization components (i.e., $H_{eff} = -(1/M_s V)\vec{\nabla} E$, where $M_s V$ is the magnetic moment if the unit volume V is magnetized to saturation). A nanomagnet may be switched by applying an easy axis field which exceeds the minimum field of switching $H_c = 2K_u/M_s$, where $K_u$ is the effective second order uniaxial anisotropy constant.

A spin current may be used to toggle a nanomagnet between its two stable states. This spin current interacts with the magnetization of the nanomagnet and exerts a torque on it. Equation (1) should therefore be modified to include this effect:

$$\frac{d\hat{m}}{dt} = -|\gamma|\hat{m} \times \vec{H}_{eff} + \alpha\hat{m} \times \frac{d\hat{m}}{dt} - |\gamma|H_\parallel\hat{m} \times (\hat{m} \times \hat{M}) - |\gamma|H_\perp\hat{m} \times \hat{M}. \quad (2)$$

$\hat{M}$ and $\hat{m}$ are unit vectors in the direction of the fixed and free layers' magnetizations, respectively. $H_\parallel \equiv \tau_\parallel/M_s V$ and $H_\perp \equiv \tau_\perp/M_s V$ are magnitudes of the magnetic fields that enter the magneto-dynamics equation due to interaction with a spin current. The quantities $\tau_\parallel$ and $\tau_\perp$ are in units of energy and are directly related to the torque exerted by the spin current. This analysis assumes that the spin current's momentum is fully absorbed by the macro-spin and that its polarization is redirected in the direction of the macro-spin once it passes a few atomic layers inside the nanomagnet. This analysis also assumes that $H_\parallel$ and $H_\perp$ are independent of the relative angle between the two magnetic layers.

Figure 3A:
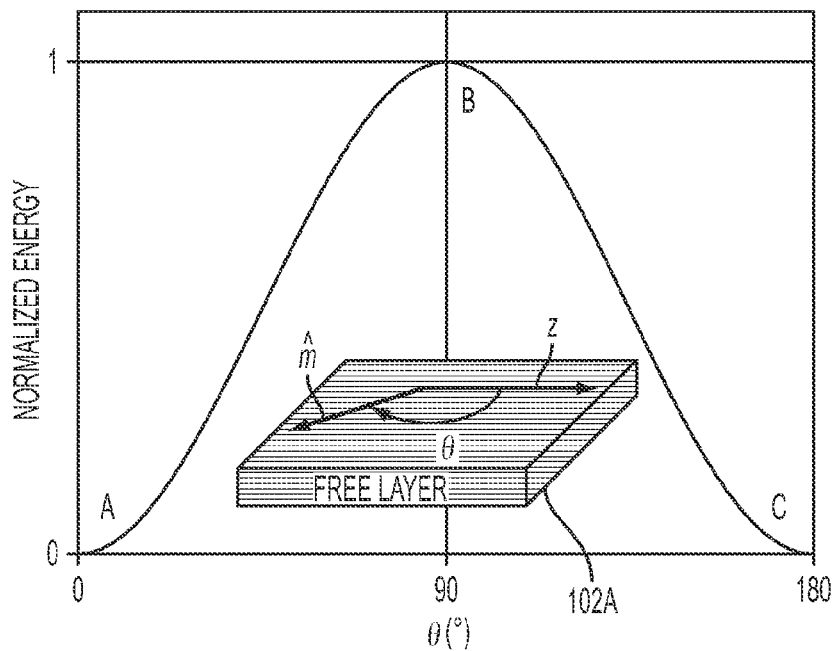
FIG. 3A illustrates an energy landscape of one embodiment of a bistable nanomagnet that may be used in the ASLD of FIG. 2.
Figure 3B:
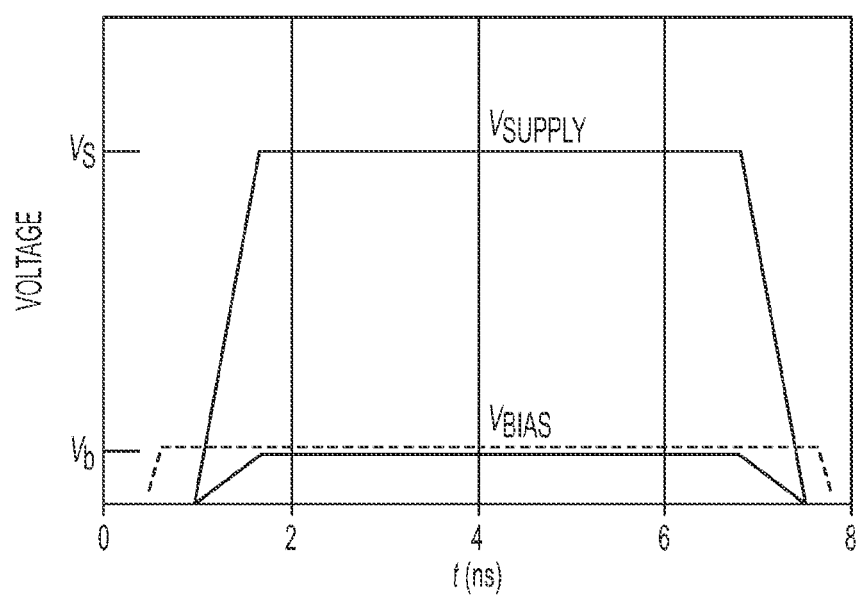
FIG. 3B illustrates one embodiment of clocked voltages that may be applied to the nanomagnets of the ASLD of FIG. 2.

For logic applications, a different switching scheme employing two spin currents may be used: a larger spin current providing the energy and a smaller spin current providing the bias that determines the final state of switching. To include the effect of both spin currents, Equation (2) is modified accordingly:

$$\frac{d\hat{m}}{dt} = -|\gamma|\hat{m} \times \vec{H}_{eff} + \alpha\hat{m} \times \frac{d\hat{m}}{dt} - |\gamma|\hat{m} \times (\hat{m} \times (H_\parallel^{clk}\hat{M}_{clk} + h_\parallel^b\hat{m}_b)) - |\gamma|\hat{m} \times (H_\perp^{clk}\hat{M}_{clk} + h_\perp^b\hat{m}_b), \quad (3)$$

where "clk" denotes the torques due to clock spin current and "b" denotes the torques due to the bias spin current. $\hat{M}_{clk}$ represents the direction of the fixed magnetic layer, which is along the hard axis of the output free layer, while $\hat{m}_b$ represents the direction of the bias, which is along the easy axis of the input free layer. The normalized magnetic moment of the output free layer is represented by $\hat{m}$. The role of the clock torques is to soften the magnetization by putting it along its hard axis. If there is bias present, it gives the magnetization a tilt from this neutral state: upon removing the clock spin current, magnetization will relax to the state dictated by the tilt. The spin current may be generated by applying a lower voltage, $V_{bias}$, to an input nanomagnet 102 of the ASLD 200 and the clock torque may be supplied by applying a higher voltage, $V_{supply}$, to an output nanomagnet 102 of the ASLD 200, as illustrated in FIG. 3B. While both torque pulses are illustrated as being turned ON and OFF at the same time in FIG. 3B, the $V_{bias}$ pulse-width can be lager than that of $V_{supply}$, as illustrated by the dotted line. In other words, exact synchronization is not necessary.

Figure 3C:
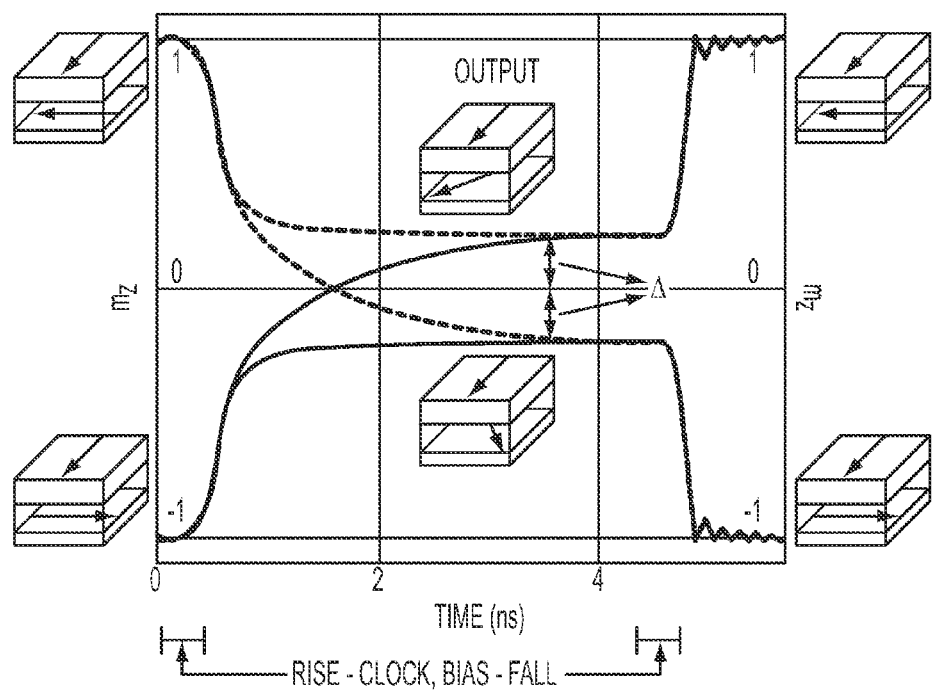
FIG. 3C illustrates logical switching of a bistable output nanomagnet having the energy landscape of FIG. 3A.

This type of logic switching using spin currents, using a free layer 102A and a fixed layer 102B with perpendicular easy axes, is illustrated in FIG. 3C. Irrespective of the initial state of the output nanomagnet 102, its final state is determined solely by the bias provided by the spin current 106. In theory, if the clock spin current is large enough to put the nanomagnet along its hard axis, then any infinitesimal bias spin current can determine the final state of switching. In practice, however, a finite spin current is needed to overcome noise and imperfections. In other words, the value of the deflection A in FIG. 3C should be larger than any deflection due to noise and other sources of error. The dependence of Δ on various pertinent parameters is discussed and quantified below. FIG. 3C was plotted using Equation (3) with the following parameters $M_s$=1100 emu/cm³ (for $Co_{60}Fe_{20}B_{20}$), $\alpha$=0.01, $H_c$=100 Oe, $H_\perp$=0.5$H_c$, $H_\parallel$=2.5$H_c$, $H_\perp$=0.8$H_c$, $H_\parallel$=5.8$H_c$, $h_\parallel^b$=0.05$H_c$, $h_\perp^b$=0.01$H_c$, and, for volume calculations only, V=180×90×2 nm³.

Since nanomagnets 102 have internal fields that prefer either of two stable states along the easy axis of the free layer 102A, they inherently digitize information which allows for large gains and error correction, as shown in FIG. 3C. After removal of the voltage pulses shown in FIG. 3B, the internal field of the output nanomagnet 102 drives the magnetization to the $m_z$=1 or $m_z$=-1 states. As noted above, this process will be successful only if the deflection A of the mid-states of magnetization (the plateaus in FIG. 3C) from $m_z=0$ is larger than noise fluctuations. Using an equipartition theorem, one can find the most probable deviation angle $\theta_{rms}$ from the easy axis at thermal equilibrium using (where $E_{ani}$ is the effective anisotropy energy barrier):

$$\sin(\theta_{rms}) = \left(\frac{k_B T}{2 E_{ani}}\right)^{\frac{1}{2}}. \quad (4)$$

Figure 4A:
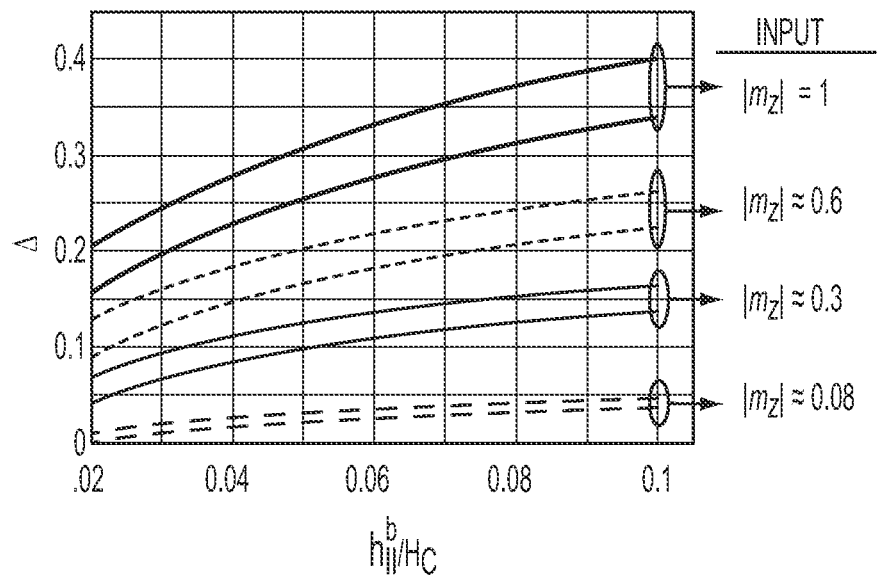
FIG. 4A illustrates the deflection required for logical switching of an output nanomagnet as a function of bias magnitude for various alignments of an input nanomagnet.
Figure 4B:
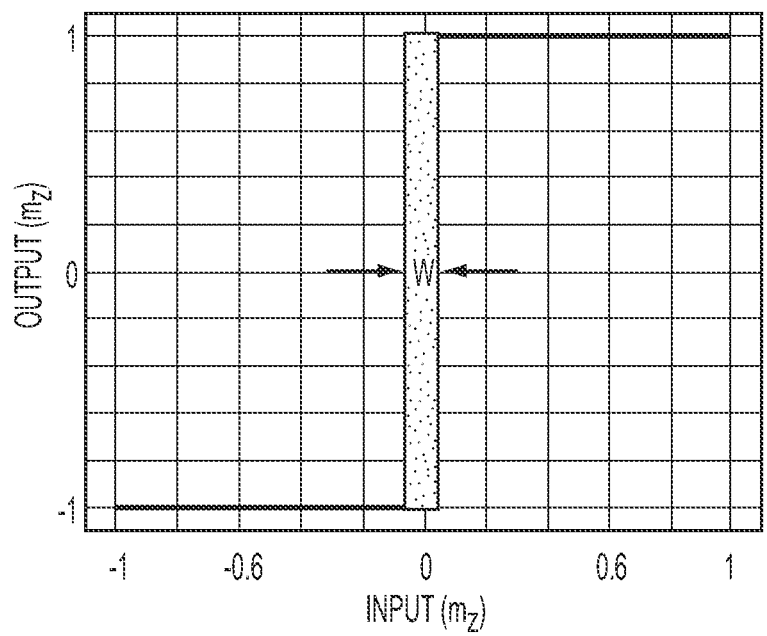
FIG. 4B illustrates one embodiment of input-output transfer characteristics for an ASLD.

Noting that $(m_z)_{rms}=\cosine(\theta_{rms})$ and using a barrier height of $E_{ani}=40 k_B T$, the fluctuations in the normalized component of magnetization along the easy axis are less than 0.01. Changes in the deflection $\Delta$ as a function of the bias magnitudes $h_{\|}^b$ and $h_{\perp}^b$ for various alignments of the input nanomagnet 102 are illustrated in FIG. 4A, in which each pair of curves corresponds to a particular alignment of the input $\hat{m}_b$. In each pair, the upper curve corresponds to $h_{\perp}^b=(\frac{1}{3})h_{\|}^b$ and the lower curve corresponds to $h_{\perp}^b=(\frac{1}{5})h_{\|}^b$. This graph demonstrates that the ASLD 200 has a wide margin for tolerating errors. This can also be seen in FIG. 4B which illustrates the input-output transfer characteristics of the ASLD 200. In practice, there will be a region W, designated by the width $\delta m$, for which operation becomes indeterministic. The actual value of $\delta m$ depends on the values of the biases $h_{\|}^b$ and $h_{\perp}^b$ that can be achieved.

The spin current density needed to overcome thermal fluctuations of about 0.01 may also be calculated. Using typical parameters of $170 \times 60 \times 2$ nm$^3$ for the volume of the nanomagnet 102, 800 emu/cm$^3$ for saturation magnetization $M_s$, with an anisotropy barrier height of approximately 40 $k_T$ (for a stability of approximately 10 years), and a damping parameter of $\alpha=0:01$, a spin current density of about $2.5 \times 10^4$ A/cm$^2$ is needed to overcome thermal fluctuations. This spin current density is about two orders of magnitude smaller than the spin current density needed to switch the output nanomagnet 102. Again, in the ASLD 200, the energy needed for switching the output nanomagnet 102 essentially comes from $V_{supply}$ and not $V_{bias}$.

For the graph of FIG. 3C, a specific pair of $H_{\|}^{clk}$ and $H_{\perp}^{clk}$ was chosen for use in Equation (3). However, the actual ratio of $H_{\|}^{clk}$ to $H_{\perp}^{clk}$ depends on experimental circumstances and changes as the applied voltage across the nanomagnet 102. What is needed for operation of the ASLD 200 is a pair of $H_{\|}^{clk}$ and $H_{\perp}^{clk}$ that can align the magnetization along its hard axis. Since $H_{\|}^{clk}$ enters Equation (3) as a non-conservative field, it is not possible to predict the final equilibrium state analytically. Simulations were performed over a wide range of $H_{\|}^{clk}$ and $H_{\perp}^{clk}$ to find various combinations of these quantities that result in a successful logic switching event.

Figure 5A:
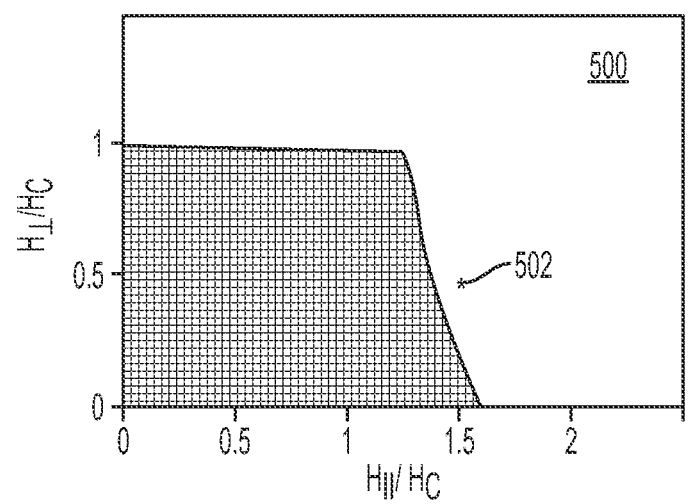
FIG. 5A illustrates a phase diagram for a single-pulse switching scheme.

A phase diagram for a single-pulse switching scheme was plotted using Equation (2) and is illustrated in FIG. 5A. This figure shows the case of anti-parallel to parallel switching under the influence of both $H_{\|}$ and $H_{\perp}$. These two variables were varied independently to produce the two-dimensional grid shown in FIG. 5A with approximately 18,000 data points. The white areas 500 of the grid represent the regions for which switching occurs. If $H_{\|}$ was zero, with $H_{\perp}=\tau_{\perp}/M_s V$ independent of $\theta$, the last term of Equation (2) behaves as an ordinary magnetic field (as compared to the first term), and hence the magnet switches when $H_{\perp}=H_c$. In nanomagnets, however, the dominant term is the third term of Equation (2), which is the primary reason behind switching. Moving along the horizontal axis with $H_{\perp}=0$, it is recognizable that switching occurs around $H_{\|} \approx 1.6 H_c$. The exact value depends on various parameters, such as $H_c$ and the ratio of this value to the demagnetizing field, as well as the damping parameter $\alpha$. If both $H_{\|}$ and $H_{\perp}$ are non-zero, then they could assist (or hinder) each other in switching. In experiments, both contributions are usually present. A known experimental value 502 is shown on the diagram in FIG. 5A, demonstrating agreement between this model and experiments. The experimental value 502 corresponds to the minimum experimentally required value for switching; that value resides in the white switching region 500 close to the black non-switching region.

Figure 5B:
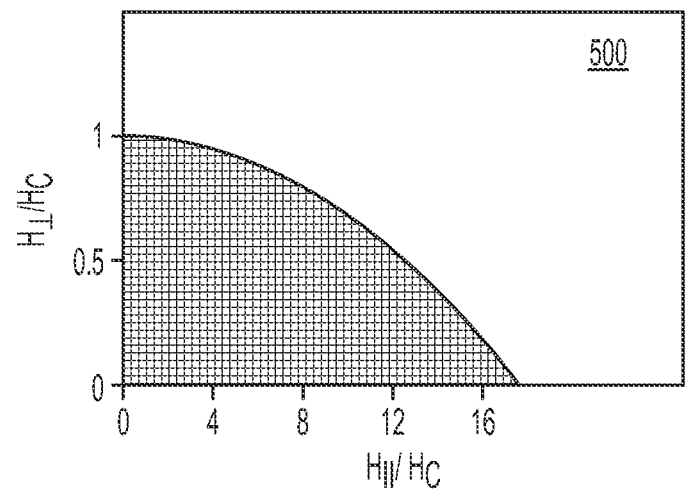
FIG. 5B illustrates a phase diagram for a two-pulse switching scheme.

A phase diagram for a two-pulse switching scheme was also plotted using Equation (3) and is illustrated in FIG. 5B. Equation (3) contains four parameters ($H_{\|}^{clk}$, $H_{\perp}^{clk}$, $h_{\|}^b$, and $h_{\perp}^b$) that depend on the strength of the clock and bias spin currents. In a two dimensional phase diagram, one can freely vary two of these parameters. The effect of $h_{\|}^b$, and $h_{\perp}^b$ was discussed above with regard to when the clock spin torque is just large enough to align the free layer of a nanomagnet along its hard axis. Assuming that these biases are infinitesimally small, the dependence of switching on $H_{\|}^{clk}$ and $H_{\perp}^{clk}$ may be independently assessed. The switching is successful if the magnetization of the free layer (i.e., the logic bit) is stabilized in a direction slightly tilted from the hard axis towards the direction of the bias (i.e., the z direction). This way the internal field of the nanomagnet will relax the magnetization to the intended stable state once $V_{supply}$ is removed. The white areas 500 in FIG. 5B show the regions for which this condition is satisfied. For both FIGS. 5A and 5B, the parameters used were: $M_s=1100$ emu/cm$^3$, $\alpha=0.008$, $H_c=45$ Oe, and, for volume calculations only, $V=250 \times 70 \times 2$ nm$^3$.

To make general purpose digital logic circuits, a minimal set of Boolean logic operations from which all other logical functions can be constructed is needed. A complete minimal set is composed of a basic binary operator like logical AND or logical OR and the unary operator NOT. AND and OR gates can be combined with inversion to make NAND and NOR gates respectively, which are universal logic gates. As will be explained shortly, a minimal set of Boolean logic gates can be constructed using a number of ASLD. When using the ASLD 200, the transfer of information in a chain of concatenated gates can be achieved by proper clocking As will be described further below, when using other embodiments of the ASLD, clocking may not be necessary.

Figure 6A:
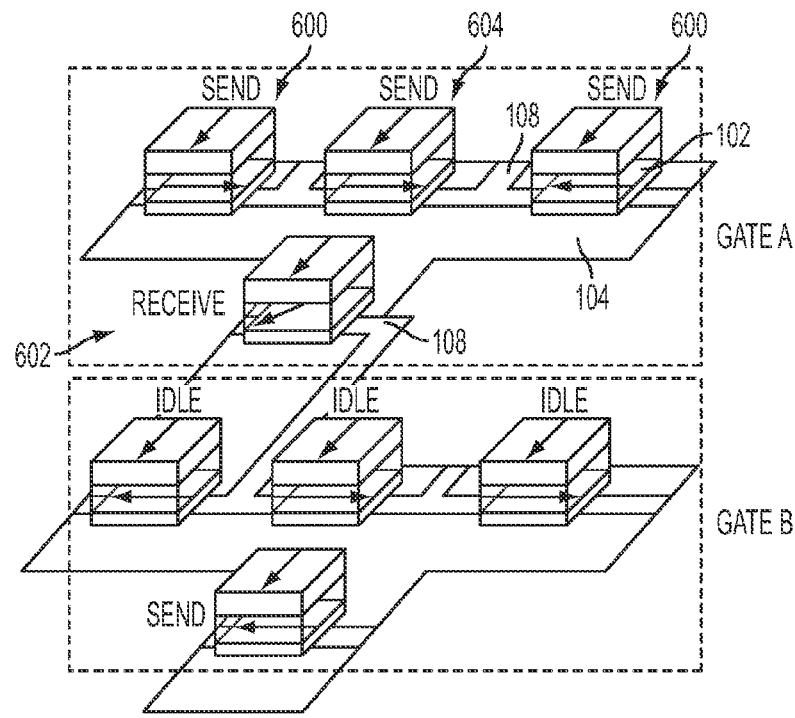
FIG. 6A illustrates one embodiment of logic gates comprising a number of ASLD, during a first phase of an exemplary clocking cycle.
Figure 6B:
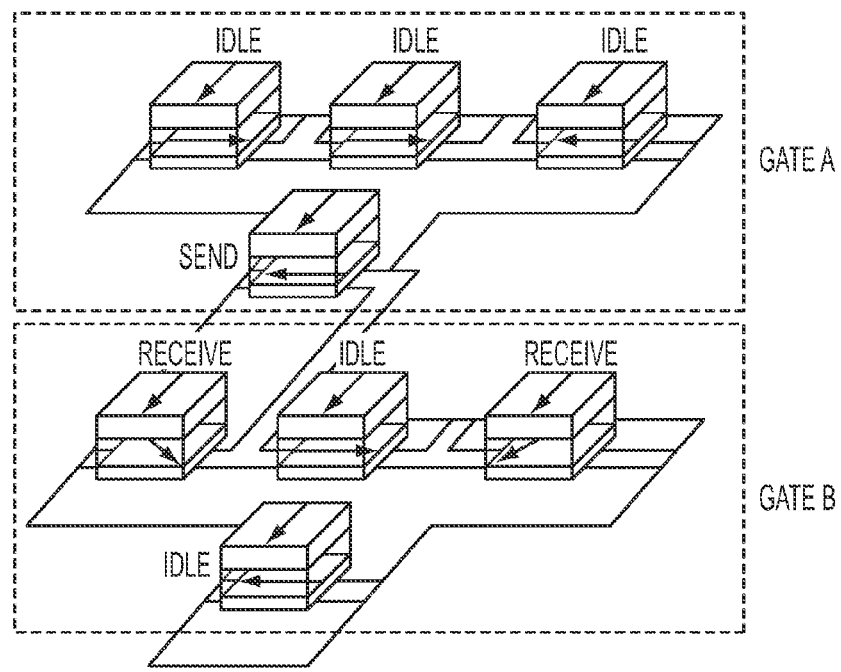
FIG. 6B illustrates the logic gates of FIG. 6A, during a second phase of the exemplary clocking cycle.
Figure 6C:
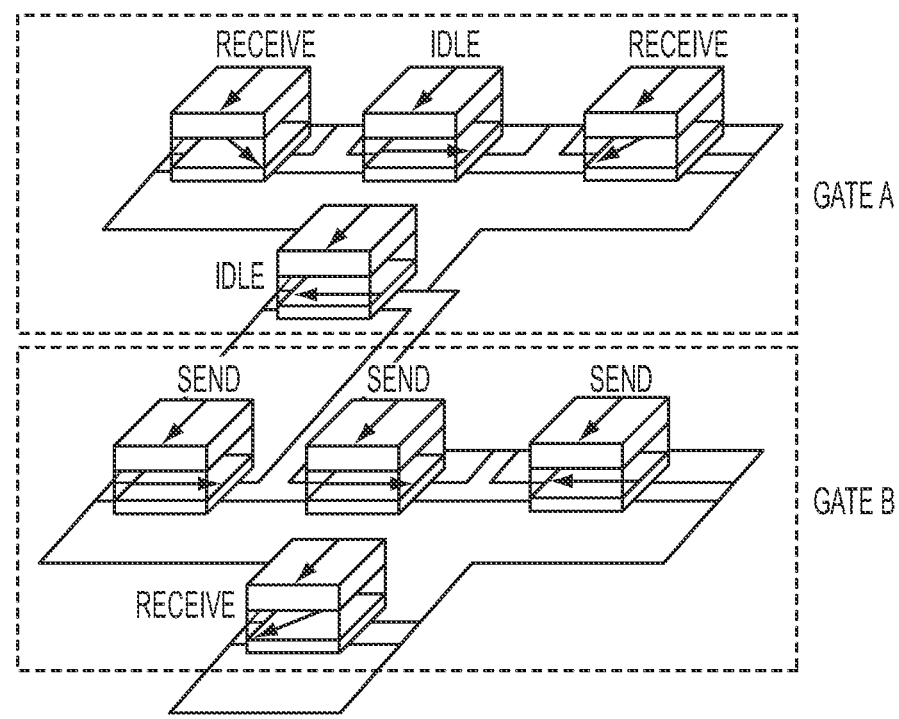
FIG. 6C illustrates the logic gates of FIG. 6A, during a third phase of the exemplary clocking cycle.

One illustrative embodiment of a digital logic circuit including a number of ASLD 200 is illustrated in FIGS. 6A-C. In this illustrative embodiment, both gate A and gate B are have two data inputs 600, one data output 602, and a fixed input 604 (each comprising one nanomagnet 102). The spin-coherent channels 104 linking the nanomagnets 102 are separated by isolation layers 108. In gate A, both data inputs 600 (as well as the fixed input 604) are in a "send" mode. The final state of the data output 602, in a "receive" mode, is determined by the superposition of spin currents injected from the inputs 600, 604 into the spin-coherent channel 104. The polarity of $V_{bias}$ determines whether the operation is a COPY or a NOT, because the ferromagnetic contact can be used in a majority spin injection mode or in a minority spin accumulation mode. As such, the gate can function as either an AND/OR logic gate or a NAND/NOR logic gate. The state of the fixed input 604 toggles the functionality between AND and OR, or between NAND and NOR. In the illustrative embodiment, gate B has a similar composition to gate A.

Three phases of clocking and signal transmission from one gate to the next are illustrated sequentially in FIGS. 6A-6C. Information travels in response to the application of appropriate voltages to each stage of nanomagnets 102. Each nanomagnet 102 is in the "send" mode when $V_{bias}$ is applied to it. Each nanomagnet 102 is in the "receive" mode when $V_{supply}$ is applied to it. Finally, each nanomagnet 102 is in an "idle" mode if it is grounded. The "idle" mode serves to prevent a nanomagnet 102 from interfering with the writing process on other nanomagnets 102 with which it shares a spin-coherent channel 104. Except for the fixed inputs 604, which don't use the "receive" mode, all nanomagnets 102 go through the three stages of receive, send, and idle in a cyclic fashion, as is illustrated in FIGS. 6A-6C. If advantageous, even the fixed inputs 604 can be reconfigured to allow toggling between AND and OR, or between NAND and NOR. Where reconfiguration is not a desired feature, it is not necessary to have a fixed layer 102B with 90° polarization in the nanomagnets 102 serving as the fixed inputs 604.

Figures 7A, 7B:
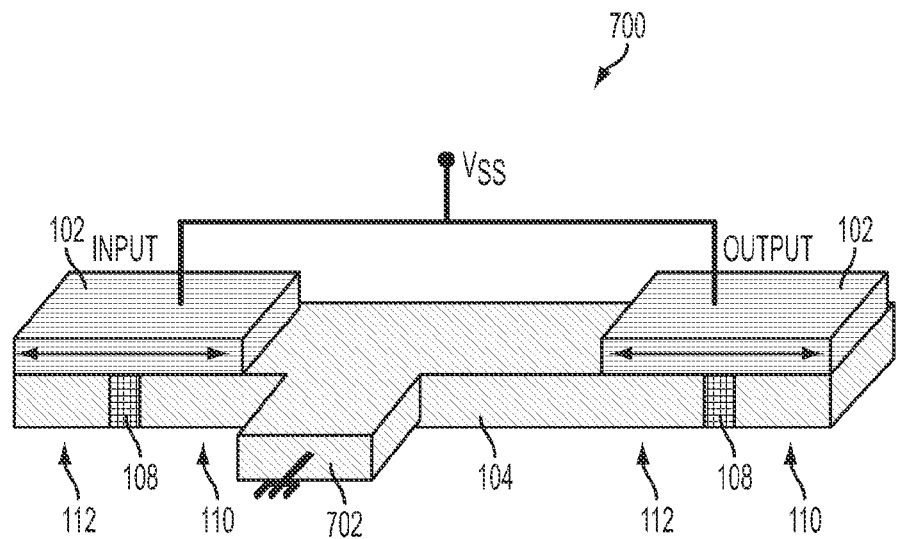
FIG. 7A illustrates another embodiment of an ASLD in which the spin-coherent channel comprises a ground terminal positioned closer to an input nanomagnet than to an output nanomagnet.
FIG. 7B illustrates a state diagram for the nanomagnets of the ASLD of FIG. 7A.

Referring now to FIG. 7A, another illustrative embodiment of an ASLD 700 is shown. The ASLD 700 of FIG. 7A has a similar configuration to the ASLD 100 of FIG. 1, except that the spin-coherent channel 104 includes a ground terminal 702 that is positioned closer to the first nanomagnet 102 than to the second nanomagnet 102. As described further below, this positioning of the ground terminal 702 causes the first nanomagnet 102 to act as an input and the second nanomagnet 102 to act as an output. As with the ASLD 100, the first and second nanomagnets 102 of the ASLD 700 may have identical switching characteristics in some embodiments. As shown in FIG. 7A, the first and second nanomagnets 102 are each electrically coupled to a supply voltage, $V_{ss}$. In the illustrative embodiment, the supply voltage is unclocked, i.e., constantly applied during operation. It will be appreciated that, in some embodiments, the supply voltage may be intermittently turned off to reduce power consumption of the ASLD 700. Even when the supply voltage is removed, however, the nanomagnets 102 will retain their states, acting as a non-volatile memory.

As described above with reference to FIG. 1, each nanomagnet 102 may have an input side 110 (i.e., a "talking" side) that transmits information and an output side 112 (i.e., a "listening" side) that receives information. An isolation layer 108 may separate two spin-coherent channels 104 below the nanomagnet 102 (one spin-coherent channel 104 being associated with the input side 110 and another spin-coherent channel 104 being associated with the output side 112). Therefore, each nanomagnet 102 can interact independently with different nanomagnets 102 on either side, allowing for a number of cascaded ASLD 700.

FIG. 7B illustrates a state diagram for two nanomagnets 102 connected by a spin-coherent channel 104. When the supply voltage is absent, the two nanomagnets 102 in FIG. 7A can exist in any of four possible states, denoted as 00, 01, 10, 11 (the input nanomagnet 102 being the first bit and the output nanomagnet 102 being the second bit). As the supply voltage is increased beyond a positive threshold value, however, the only stable states are those for which the two nanomagnets 102 are anti-parallel, namely 01 and 10. On the other hand, if the supply voltage is negative beyond a certain threshold value, the only stable states are those for which the two nanomagnets 102 are parallel, namely 00 and 11. These stable states are the ones shown in FIG. 7B with arrows pointing back to themselves. The operation with a positive supply voltage can be viewed as a NOT operation, while the operation with a negative supply voltage can be viewed as a COPY operation. It should also be appreciated that the transition arrows in the table are always "vertical" and never "horizontal." Due to the non-reciprocity of the ASLD 700, it is always the output nanomagnet 102 that changes its magnetization appropriately to reach a stable state, never the input nanomagnet 102. In other words, the two nanomagnets 102 of the ASLD 700, even when identical structures, function as the input and the output respectively, with an input-output isolation that is characteristic of transistors.

In the ASLD 700, the asymmetric positioning of the ground terminal 702 results in the first nanomagnet 102 effectively shielding the second nanomagnet 102 from communicating with the ground terminal 702, thereby reducing the charge current and consequently the spin current ($\vec{I}_S$) injected by the second nanomagnet 102 as compared to the first nanomagnet 102. As a result the torque exerted on the second nanomagnet 102, given by $\vec{T}_S = \hat{m}_2 \times (\vec{I}_{S2} \times \hat{m}_2)$, is greater than the torque exerted on the first nanomagnet 102. This effect is captured by the distributed conductance network model illustrated in FIG. 7D, which is based on the coupled spin-transport/magneto-dynamics model shown in FIG. 7C. As shown in FIG. 7D, the ASLD 700 may be modeled as a number of conductance elements (each comprising a 4 by 4 tensor), which accounts for the spatial variation of quasi-Fermi levels in the spin-coherent channel 104, for charge as well as each spin component.

Figure 7C:
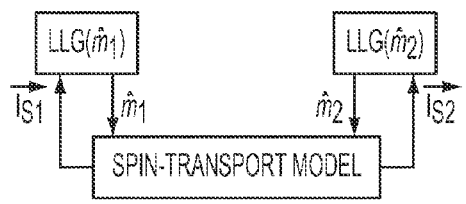
FIG. 7C illustrates one embodiment of a coupled spin-transport/magneto-dynamics model for the ASLD of FIG. 7A.
Figure 7D:
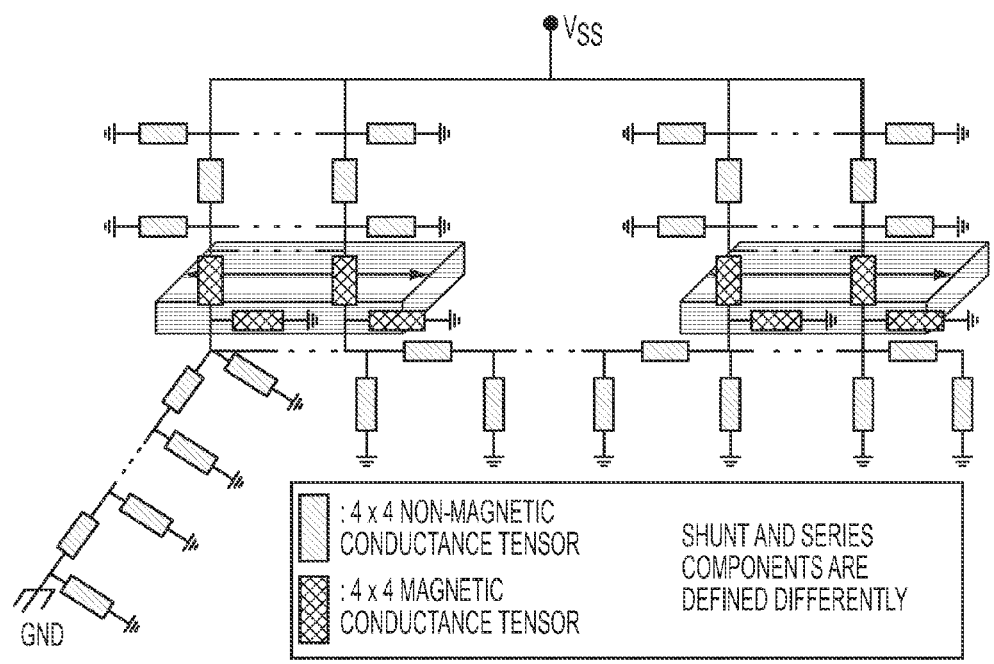
FIG. 7D illustrates one embodiment of a distributed conductance network model for the ASLD of FIG. 7A.
Figure 7E:
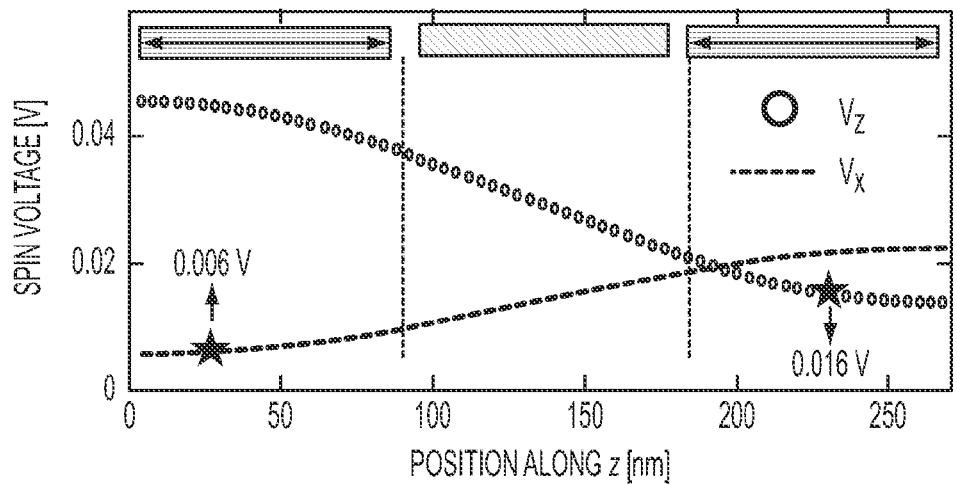
FIG. 7E illustrates components of the spin voltage in a spin-coherent channel of the ASLD of FIG. 7A.
Figure 7F:
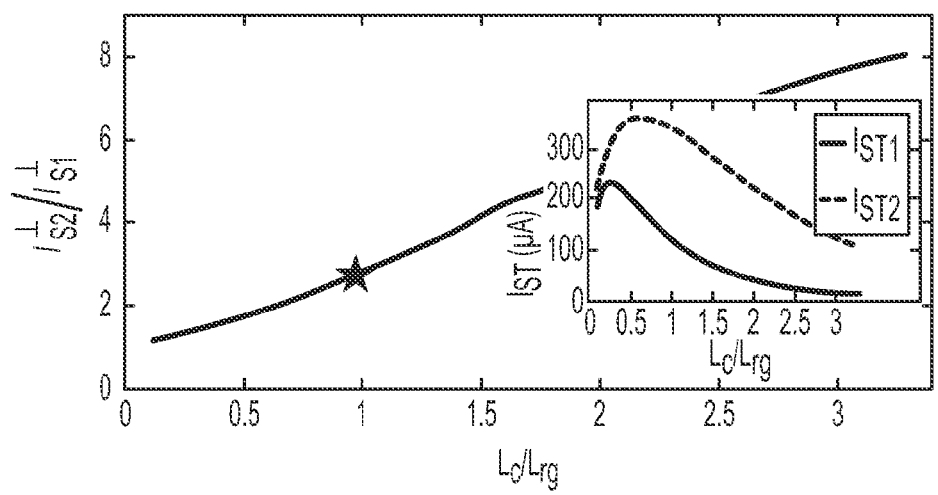
FIG. 7F illustrates a ratio of torques exerted on the input and output nanomagnets of the ASLD of FIG. 7A as a function of contact length normalized to transfer length.

As one illustrative example, FIGS. 7E and 7F show the numerical results for the specific case when the first nanomagnet 102 is along z and the second nanomagnet 102 is along x. FIG. 7E shows how a higher injection by the first nanomagnet 102 results in a larger z spin voltage distribution in the vicinity of the second nanomagnet 102 compared to the x spin voltage in the vicinity of the first nanomagnet 102. The ability of the input nanomagnet 102 to shield the output nanomagnet 102 from the ground terminal depends on the ratio of the magnet contact length ($L_a$) to the transfer length of the contact which is of the order: $L_{rg}=1/\sqrt{(g\rho)/(WA)}$, where g is the contact conductance, $\rho$ is the channel resistivity, W is the width of the channel, and A is the cross-sectional area of the channel. The ratio of spin-torques, $I_{S2}^\perp/I_{S1}^\perp$, follows from $V_Z/V_X$, as can be seen by comparing FIGS. 7E and 7F. FIG. 7E was simulated for the particular case of $L_c \sim L_{rg}$, and the corresponding point can be identified in FIG. 7F.

Figure 8A:
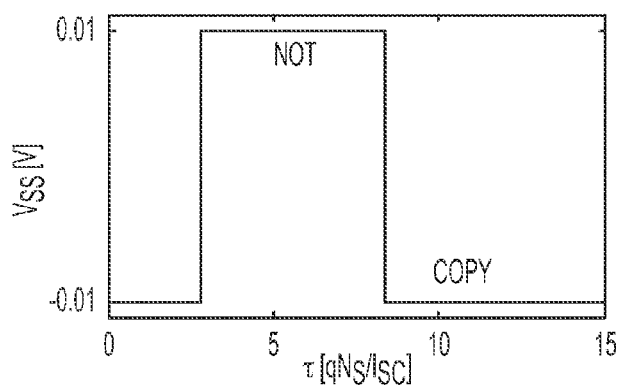
FIG. 8A illustrates one embodiment of un-clocked supply voltages that may be applied to the input and output nanomagnets of the ASLD of FIG. 7A.
Figure 8B:
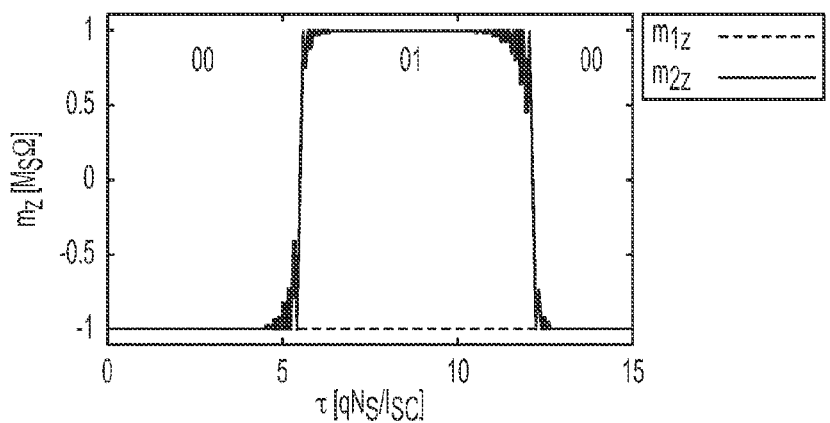
FIG. 8B illustrates a magnetization direction of the output nanomagnet of the ASLD of FIG. 7A in response to the un-clocked supply voltages of FIG. 8A, where the input nanomagnet has a magnetization direction representing a logical zero.
Figure 8C:
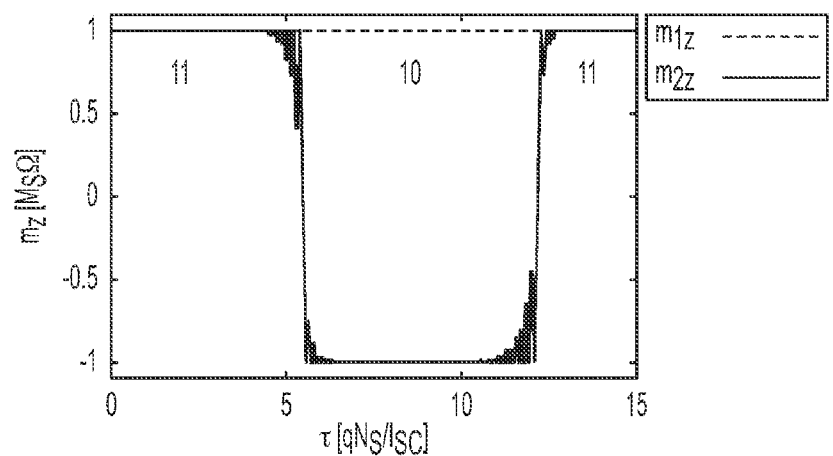
FIG. 8C illustrates a magnetization direction of the output nanomagnet of the ASLD of FIG. 7A in response to the un-clocked supply voltages of FIG. 8A, where the input nanomagnet has a magnetization direction representing a logical one.

FIGS. 8A-C illustrate a typical simulation result for the ASLD 700 using the coupled spin-transport/magneto-dynamics model of FIG. 7C and the dynamics of magnetization ($\hat{m}$) described by the LLG equation:

$$\frac{d\hat{m}}{dt} = -|\gamma|\hat{m} \times \vec{H}_{int} + \alpha\hat{m} \times \frac{d\hat{m}}{dt} + \frac{I_s^\perp}{qN_s}. \tag{5}$$

Each nanomagnet 102 is described by a separate LLG equation. $N_s$ is the net number of Bohr magnetons in one of the nanomagnets 102, given by $N_s = M_s\Omega/\mu_B$ (where $M_s$ is the saturation magnetization, $\Omega$ is the volume, and $\mu_B$ is the Bohr magneton). The solid curves in FIGS. 8B and 8C represent the state of the output nanomagnet 102, and the dashed curves represent the state of the input nanomagnet 102 as a function of the dimensionless time $\tau$ in units of $qN_s/I_{sc}$. $I_{sc}$ is the critical spin current needed for switching, given by:

$$I_{sc} = \frac{2q}{\hbar}(2\alpha E_b)\left(1 + \frac{H_d}{2H_K}\right), \tag{6}$$

where $\hbar$ is the reduced Plank's constant, $E_b$ is the anisotropy energy barrier, $H_d$ is the demagnetizing field, and $H_K$ is the uniaxial anisotropy field.

As shown in FIG. 8A, the supply voltage applied to the ASLD 700 begins at a negative value, switches to positive value, and returns to a negative value. In FIG. 8B, the ASLD 700 was initialized in the parallel state 00. With a negative initial supply voltage, the parallel states are stable and the state 00 is retained. When the supply voltage is made positive, the output nanomagnet 102 becomes the NOT of input nanomagnet 102 and the anti-parallel state 01 is reached (which is now stable). The ASLD 700 again reaches the parallel state 00 when the supply voltage is changed back to a negative value. Similarly, in FIG. 8C, the ASLD 700 was initialized in the parallel state 11. With a negative initial supply voltage, the parallel states are stable and the state 11 is retained. When the supply voltage is made positive, the output nanomagnet 102 becomes the NOT of input nanomagnet 102 and the anti-parallel state 10 is reached (which is now stable). The ASLD 700 again reaches the parallel state 11 when the supply voltage is changed back to a negative value.

Figure 9:
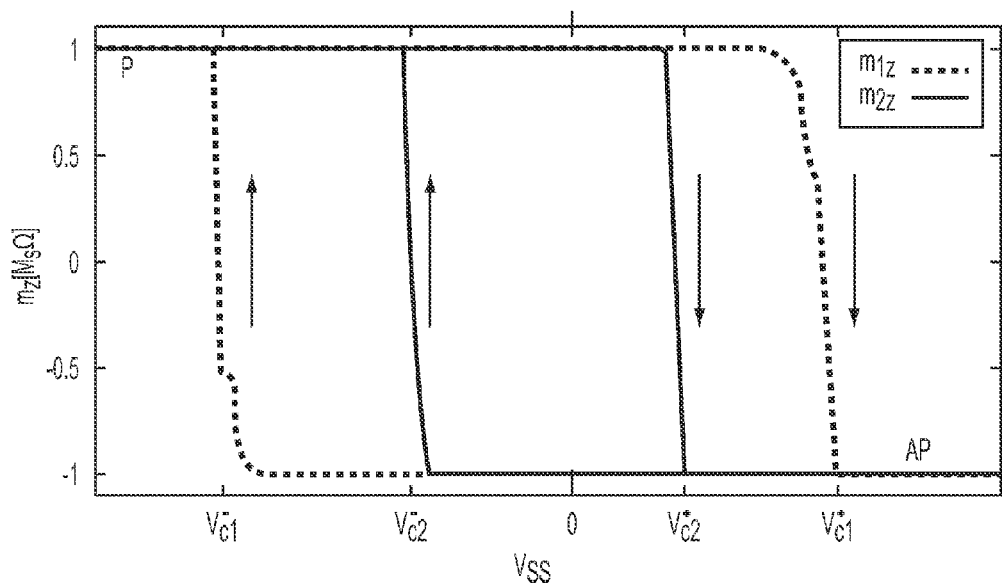
FIG. 9 illustrates logical switching voltages for the input and output nanomagnets of the ASLD of FIG. 7A.

Even if both nanomagnets 102 of the ASLD 700 initially start to switch after one of the transitions of the supply voltage in FIG. 8A, the output nanomagnet 102 gets going faster and soon the input nanomagnet 102 goes back to its initial state, since the overall objective of both nanomagnets 102 is the same: an anti-parallel configuration for positive supply voltages, or a parallel configuration for negative supply voltages. As the input nanomagnet 102 is closer to the ground terminal 702, it is more efficient in generating the spin currents that cause the output nanomagnet 102 to switch states. As illustrated in FIG. 9, the critical voltage ($V_{c1}$) required to switch the input nanomagnet 102 is greater in magnitude than the critical voltage ($V_{c2}$) required to switch the output nanomagnet 102. The difference between these critical voltages arises from the asymmetry in the ASLD 700 (i.e., for a symmetrical ASLD, $V_{c1}=V_{c2}$). In other words, the asymmetry of the ASLD 700 dictates that a higher voltage is required to generate enough spin current to switch the input nanomagnet 102. The difference between the critical voltages ($V_{c1}-V_{c2}$) is a direct measure of the non-reciprocity in the system.

As shown in FIG. 9, $V_{c1}$ and $V_{c2}$ delineate the range of supply voltages into three distinct regimes. When $V_{SS}<V_{c2}$, neither nanomagnet 102 has enough spin current to switch, and all four states (i.e., 00, 10, 11, 01) are stable. When $V_{c2}<V_{SS}<V_{c1}$, only the output nanomagnet 102 has enough spin current to switch, and the nanomagnets 102 stabilize in either parallel or anti-parallel states. When $V_{SS}>V_{c1}$, there is sufficient torque acting on both nanomagnets 102 to switch either of them, but only the output nanomagnet 102 switches. The induced asymmetry ensures that the torque on the output nanomagnet 102 is greater than the torque on the input nanomagnet 102. Additional schemes for creating this asymmetry in other embodiments of the ASLD are discussed below.

Figure 10A:
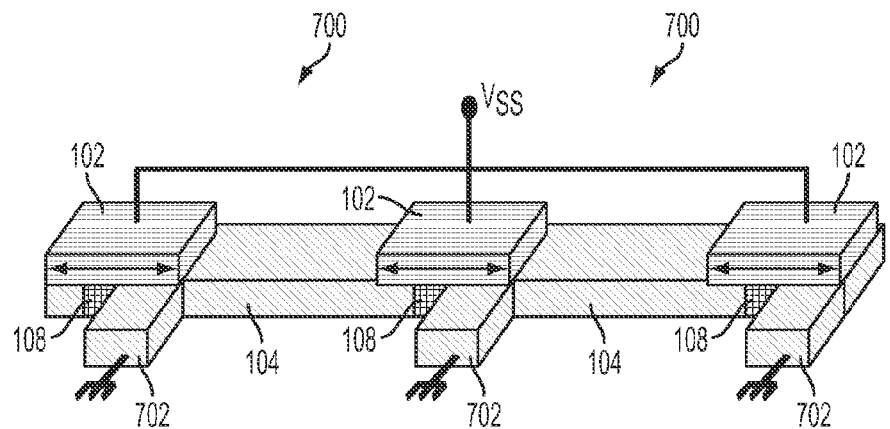
FIG. 10A illustrates one embodiment of a cascaded chain of ASLD including first, second, and third nanomagnets.
Figure 10B:
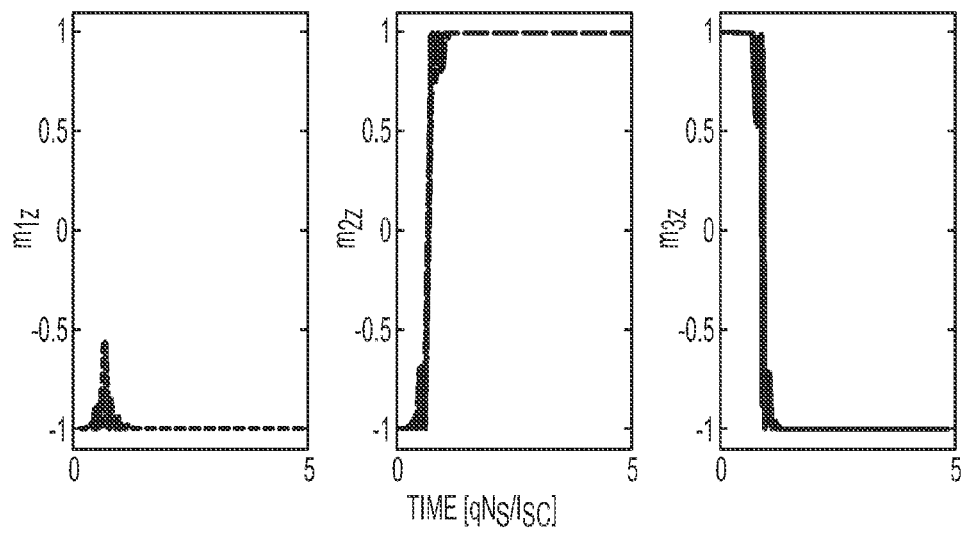
FIG. 10B illustrates a magnetization direction of each of the first, second, and third nanomagnets of the ASLD of FIG. 10A after a positive supply voltage has been applied, where the input nanomagnet has a magnetization direction representing a logical zero.

Referring now to FIG. 10A, a number of ASLD 700 may be cascaded to construct digital circuits. In the illustrative embodiment of FIG. 10A, first and second nanomagnets 102 are linked by a first spin-coherent channel 104, while second and third nanomagnets 102 are linked by a second spin-coherent channel 104. As described above, isolation layers 108 prevent cross-talk between the spin-coherent channels 104. When a positive supply voltage is applied to the circuit of FIG. 10A, each nanomagnet 102 tries to invert the other nanomagnets 102 connected to it. However, the positioning of the ground terminal 702 of each spin-coherent channel 104 enforces a directed transfer of information (i.e., magnetization) in a specific order: 1→2→3. Consequently, the circuit shown in FIG. 10A behaves as a chain of inverters. This is illustrated in FIG. 10B, which shows the states of the first, second, and third nanomagnets 102 over time in individual plots. Initially, both the first nanomagnet 102 and the second nanomagnet 102 start to switch. However, the first nanomagnet 102 dominates, and the second nanomagnet 102 gets inverted from logical "0" to a logical "1." Subsequently, the second nanomagnet 102 inverts the third nanomagnet 102, and the system becomes stable. It should be appreciated that the first, second, and third nanomagnets may have identical switching characteristics, in some embodiments, and that no clocking is needed for the circuit of FIG. 10A.

Figure 11A:
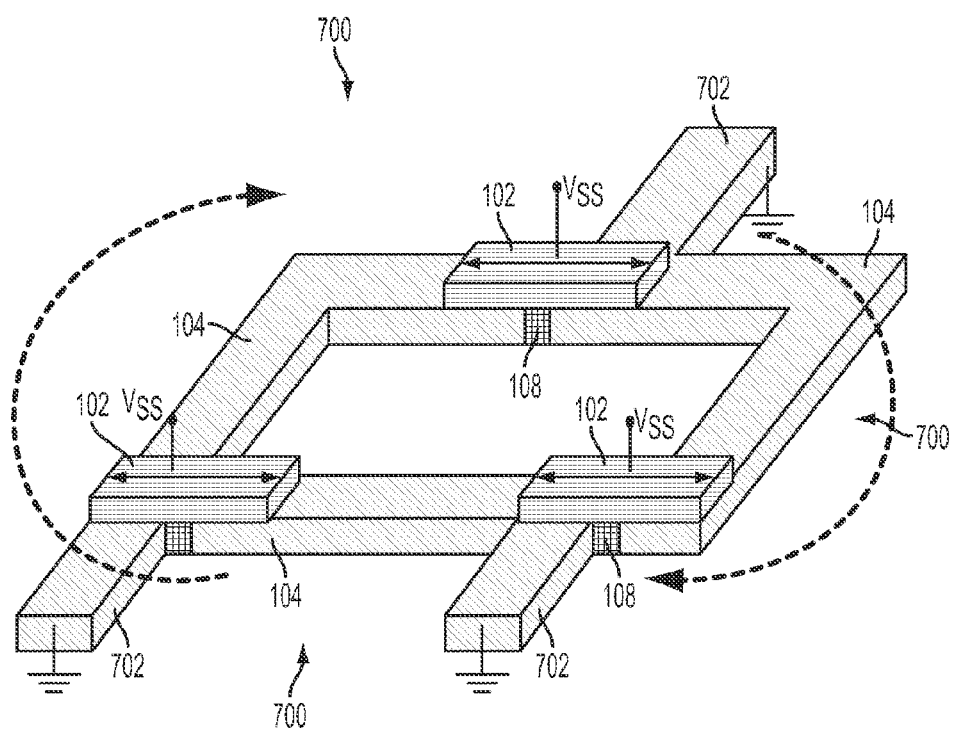
FIG. 11A illustrates another embodiment of a cascaded chain of ASLD forming a ring oscillator including first, second, and third nanomagnets.
Figure 11B:
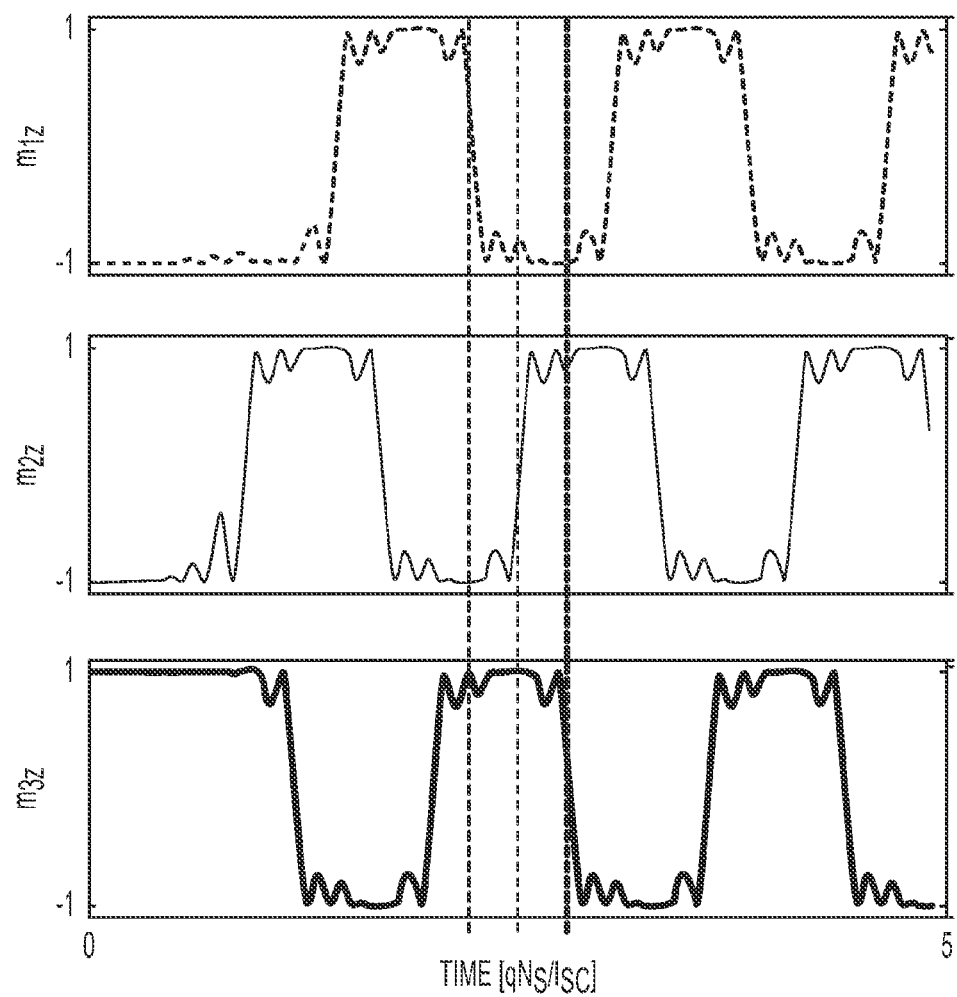
FIG. 11B illustrates an oscillating magnetization direction of each of the first, second, and third nanomagnets of the ring oscillator of FIG. 11A after a positive supply voltage has been applied.

Another illustrative embodiment of a digital circuit including a number of cascaded ASLD 700 is illustrated in FIG. 11A. The circuit of FIG. 11A is similar to the circuit of FIG. 10A, except that the third and first nanomagnets 102 are also linked by a third spin-coherent channel 104, forming a ring oscillator. When a supply voltage is applied to the ring oscillator, each nanomagnet 102 will invert the state of the next nanomagnet 102 in a cyclic fashion. This ring oscillator allows sufficient feedback from the third nanomagnet 102 to drive a first nanomagnet 102 having identical switching characteristics, without any clocking circuitry. The switching edges of the first, second, and third nanomagnets 102 are identified by vertical dashed lines in FIG. 11B and show the step by step process of information transfer from one nanomagnet 102 to the next. It is contemplated that the ASLD 700 may be used to construct additional digital circuits (e.g., a set of Boolean logic gates).

In addition to the ground terminal 702 of the ASLD 700 described above, other asymmetries may be used to provide non-reciprocity to an ASLD. The degree of non-reciprocity of an ASLD can be arrived at by defining a "spin-torque conductance" ($g_s$) relating the spin-torque component of the current at each nanomagnet in the ASLD to the supply voltage:

$$|\vec{T}_{s1}^{\perp}|=\hat{m}_1\times(\vec{T}_{s1}\times\hat{m}_1)|=g_{s1}V_{SS} \quad (7),$$

$$|\vec{T}_{s2}^{\perp}|=|\hat{m}_2\times(\vec{T}_{s2}\times\hat{m}_2)|=g_{s2}V_{SS} \quad (8).$$

Of the two nanomagnets in an ASLD, the nanomagnet with the greater spin-torque conductance ($g_s$) will function as the output.

Figure 12:
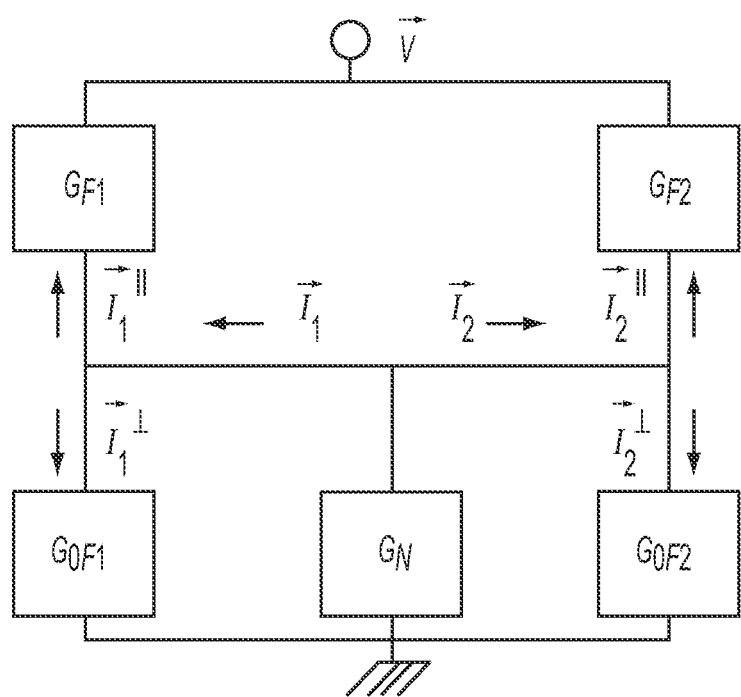
FIG. 12 illustrates one embodiment of a circuit representation of an ASLD.

FIG. 12 illustrates a simplified conductance model that may be used to analyze an ASLD structure. This model allows us to obtain an exact analytical expression that matches the distributed numerical model in FIG. 7D for near ballistic channels. Each of the conductances in this model will be a 4×4 matrix that relates 4×1 voltages and currents that include charge and the three spin components, i.e. $[c,z,x,y]^T$. For a ferromagnet in the 'z' direction, the interface conductances are given by $G_F$ and $G_{0F}$:

$$G_F = \begin{pmatrix} g_F & g_\alpha & 0 & 0 \\ g_\alpha & g_F & 0 & 0 \\ 0 & 0 & 0 & 0 \\ 0 & 0 & 0 & 0 \end{pmatrix}, G_{0F} = \begin{pmatrix} 0 & 0 & 0 & 0 \\ 0 & 0 & 0 & 0 \\ 0 & 0 & g_\beta & -g_\gamma \\ 0 & 0 & g_\gamma & g_\beta \end{pmatrix}, \quad (9)$$

where $g_F$ is the conductance of the $F_M$/interface region, $g_\alpha=Pg_F$, and P is the effective polarization of the FM interface. $g_\beta$ and $g_\gamma$ refer to the effective spin "mixing" conductance of the interface and describe the Slonczewski and field-like components of spin torque, respectively. $g_\gamma$ may be set to zero because the field-like term is generally very small in all-metallic structures. The lead to the ground terminal may be assumed to be unpolarized with the absence of any spin-orbit interaction effects (thereby, equally affecting all spin components) and can be described by a matrix:

$$G_N = \begin{pmatrix} g_0 & 0 & 0 & 0 \\ 0 & g_{0P} & 0 & 0 \\ 0 & 0 & g_{0P} & 0 \\ 0 & 0 & 0 & g_{0P} \end{pmatrix}, \text{ where } g_0 = \frac{A}{\rho L} \text{ and} \tag{10}$$

$$g_{0P} = \frac{A}{\rho L} \coth\left(\frac{L}{\lambda}\right).$$

$\rho$, $\lambda$, L and A refer to the resistivity, spin-diffusion length, length and cross section of the lead, respectively. Solving the conductance model of FIG. 12 provides an expression for the degree of non-reciprocity:

$$\frac{g_{s2}}{g_{s1}} \equiv \left|\frac{I_{s2}^+}{I_{s1}^+}\right| = \left(\frac{g_{\beta 2}}{g_{\beta 1}}\right) \frac{g_{\alpha 1}(g_{0P} + g_{F2}) + g_{\alpha 2}g_{F1} + (g_{\alpha 1} - g_{\alpha 2})g_{\beta 1}}{\left(2g_{\alpha 2}\cos^2\frac{\theta}{2}\right)(g_{\beta 2} - g_{F2}) +}. \tag{11}$$
$$g_{\alpha 2}(g_{0P} + g_{F1}) + g_{\alpha 1}g_{F2} + (g_{\alpha 2} - g_{\alpha 1})g_{\beta 2}$$

For two perpendicular magnets ($\theta = \pi/2$), the expression simplifies to:

$$\left|\frac{g_{s2}}{g_{s1}}\right| = \frac{g_{\alpha 1}g_{\beta 2}(g_{\beta 1} + g_{0P} + g_{F2})}{g_{\alpha 2}g_{\beta 1}(g_{\beta 2} + g_{0P} + g_{F1})}. \tag{12}$$

Equation (12) may used to evaluate several possibilities for implementing non-reciprocity in an ASLD. For instance, the non-reciprocity of an ASLD depends on how well the input nanomagnet can inject polarized spin current ($g_{\alpha 1}$) and how easily the output nanomagnet can relax the non-collinear spins ($g_{\beta 2}$), and vice-versa. As described above, the insertion of a tunnel barrier 114 at an interface between the spin-coherent channel 104 and one of the nanomagnets 102 may introduce or improve non-reciprocity. In other embodiments, the input and output nanomagnets 102 may be designed with different interface areas to the spin-coherent channel 104. It is contemplated that any suitable technique for designing different spin-torque conductances at the input and output nanomagnets 102 may be used to introduce or to improve non-reciprocity.

Figure 13A:
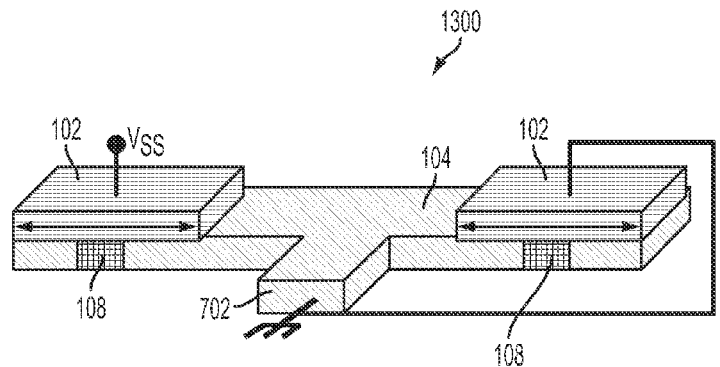
FIG. 13A illustrates one embodiment of an ASLD in which the spin-coherent channel comprises a ground terminal positioned equidistant between an input nanomagnet and an output nanomagnet.

Referring now to FIG. 13A, it is also possible to introduce non-reciprocity in a physically symmetric ASLD 1300 by applying different voltages to the two nanomagnets 102. In the illustrative embodiment of FIG. 13A, the input nanomagnet 102 of the ASLD 1300 is electrically coupled to a supply voltage, while the output nanomagnet 102 is grounded. The non-reciprocity in this case is given by:

$$\frac{|g_{s2}|}{|g_{s1}|} = 1 + \frac{\frac{g_0}{g_F}}{1 - \frac{2g_\alpha^2 \cos^2\frac{\theta}{2}}{g_F(g_F + g_{0P} + g_\beta)}}. \tag{13}$$

Figure 13B:
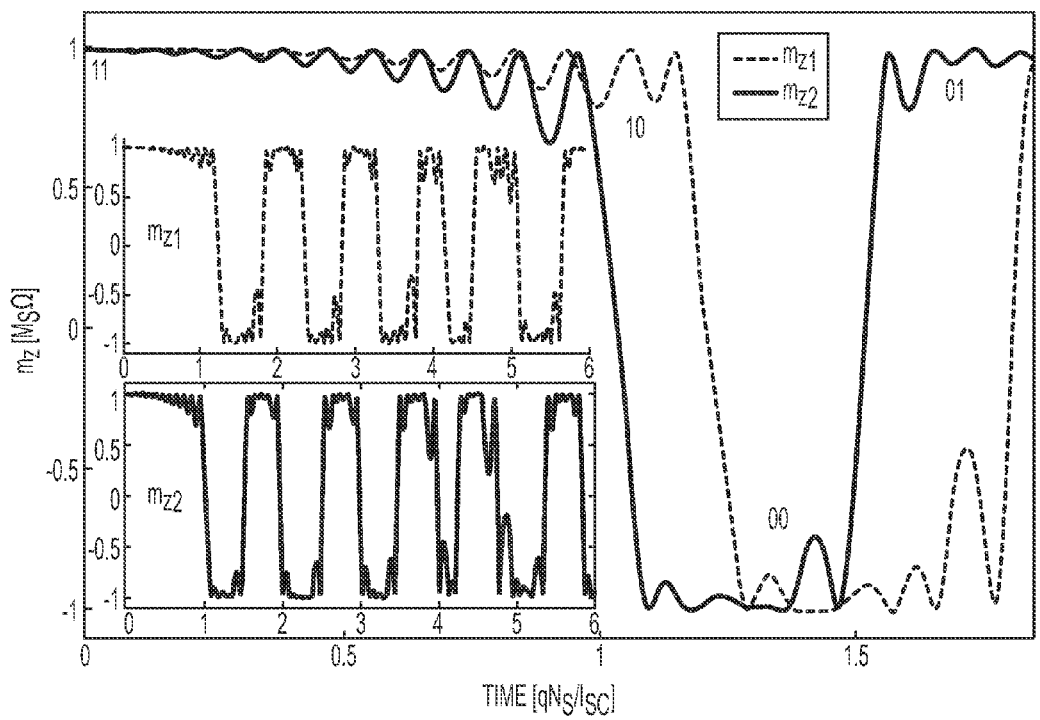
FIG. 13B illustrates an oscillating magnetization direction of each of the input and output nanomagnets of the ASLD of FIG. 13A after the output nanomagnet has been grounded and a positive supply voltage has been applied to the first nanomagnet.

In general, the nanomagnet 102 with a voltage closer to that of the ground terminal 702 ends up with a higher spin-torque conductance ($g_s$). The ASLD 1300, however, has no stable state and once the state of the output nanomagnet 102 has switched, the system continues to oscillate deterministically between all the possible states (i.e., 00, 01, 11, 10), as illustrated in FIG. 13B. These oscillations are primarily due to the fact that the nanomagnets 102 try to enforce opposite configurations as one of them is injecting spins while the other is extracting spins. In other embodiments of the ASLD 1300, the output nanomagnet 102 may be electrically coupled to a floating voltage.

There are several factors which determine the scalability of circuits employing the ASLD. The most basic requirement for scalability is small nanomagnets. One limit on the size of each nanomagnet is its thermal stability. The retention time of a magnet is given by:

$$\tau_r = \frac{e^{\frac{K_u V}{k_B T}}}{f_0}. \tag{14}$$

$f_0$ is called the attempt frequency and, for magnetic thin films used for storage purposes, is on the order of 1 GHz. $K_u V$ (V is the volume) is the height of the energy barrier separating the stable states of a magnet and should be at least $40 k_B T$ (where T is the room temperature) to give about 10 years of retention time. Many experiments have reported $K_u$ values as high as $10^7$ erg/cm$^3 \approx \frac{1}{4}$ kT/nm$^3$. Based on the aforementioned $f_0$ value, magnets with volumes on the order of 100 nm$^3$ are stable at room temperature, which translates to only a few nm in each dimension and indicates the potential for an extremely small footprint.

Power dissipation is an additional factor that should be taken into account for extremely high density large scale computational circuits and is believed to be the main road block for further downsizing of CMOS technology. The intrinsic switching energy (i.e. the energy dissipated throughout switching) of a magnet is roughly on the order of the barrier height, $K_u V$, which is at least $40 k_B T < 1$ aJ per magnet, based on the discussion above. While the magnet may be composed of millions of spins, the dissipation for switching the magnet as one giant collective entity is only a few $k_B T$. In a charge-based transistor, every single electronic charge dissipates a few $k_B T$ throughout switching. In general, switching energy and energy-delay can be written as:

$$E_{sw} = VQ_{tot}, \quad E_{sw}t_{sw} = \frac{V}{I}Q_{tot}^2, \tag{15}$$

where V and I are the charge voltage and current, respectively, and $t_{sw}$ is the switching delay. $Q_{tot} = It_{sw}$ is the total charge involved in a switching event. Equation (15) permits a simple comparison with charge-based devices, where $Q_{tot}$ is the amount of charge being switched.

Figure 14:
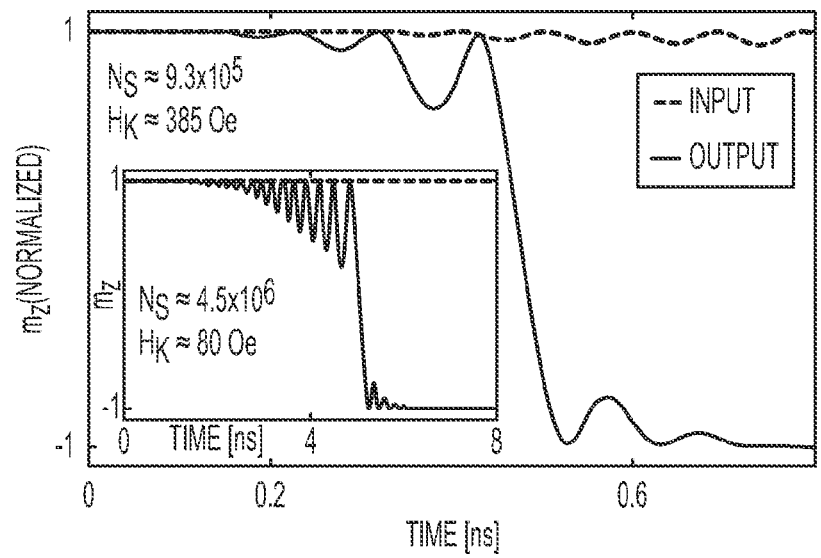
FIG. 14 illustrates logical switching speeds of two ASLD including nanomagnets with the same energy barrier, but different numbers of Bohr magnetons ($N_s$) and different internal uniaxial anisotropies ($H_K$).

The $Q_{tot}$ involved in switching an ASLD may be analyzed using the coupled spin-transport/magneto-dynamics model of FIG. 7C. Using this model, the logical switching of two output nanomagnets was plotted in FIG. 14. As shown in FIG. 14, for the same current, I, the output nanomagnet having a lower number of Bohr magnetons ($N_s$) and a higher internal uniaxial anisotropy ($H_k$) switched faster. The two output nanomagnets used in the simulation were otherwise identical. While the charge and spin currents, $I_c$ and $I_s$, continue to flow so long as a supply voltage is present, the spin-torque current $I_{st}$ that enters the LLG equation is time-limited: it flows only during the time that the nanomagnet is switching and follows the relationship:

$$\int_0^\infty I_{st}^z dt = f_1(2qN_s). \quad (16)$$

The factor $f_1$ is exactly 1 if only a uniaxial field is present. However, $f_1$ can be less or more than 1 when fields other than uniaxial are involved. The total charge $Q_{tot}$ will be larger than $f_1(2qN_s)$ and can be written as:

$$Q_{tot} = \int_0^{t_{sw}} I dt = \frac{I}{I_s} f_2 f_1(2qN_s). \quad (17)$$

where I is the charge current, $I_s$ is the time-average spin current, and $f_2 = \int I_s dt / \int I_{st}^z dt$ is a factor reflecting the fact that the spin current is larger than the spin-torque current that enters the LLG equation.

Figure 15:
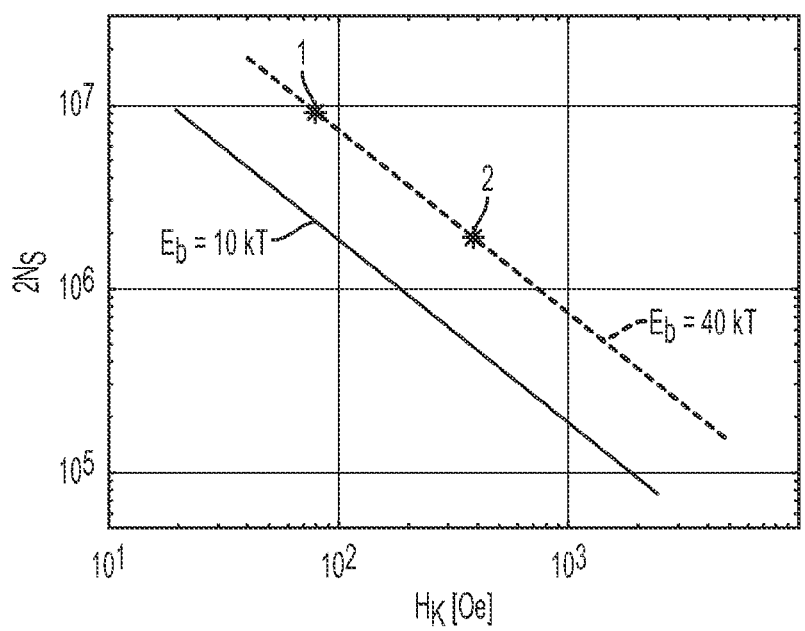
FIG. 15 illustrates the energy barrier of a nanomagnet as a function of the number of Bohr magnetons ($N_s$) in the nanomagnet and the internal uniaxial anisotropy ($H_K$) of the nanomagnet.

Thus, the $Q_{tot}$ and the switching energy-delay of an ASLD may be improved by lowering the number of Bohr magnetons ($N_s$) of the nanomagnets of the ASLD, while maintaining a fixed energy barrier ($E_b$) of at least 10 kT (i.e., at least ¼ eV at room temperature) to sustain nonvolatility of the nanomagnets. As shown in FIG. 15, this requires materials with increased $H_K$. In some embodiments, the nanomagnets used in the ASLD may comprise CoPd, CoNi, CoPtCr, Co₃Pt, FePd, FePt, CoPt, MnAl, Fe₁₄Nd₂B, and/or SmCo₅, all which are have relatively high $H_K$ values. Data points 1 and 2 in FIG. 15 represent the two nanomagnets simulated in FIG. 14. It will be appreciated that such fixed energy scaling through increased $H_K$ results in increased switching speed without an increase in current.

While the disclosure has been illustrated and described in detail in the drawings and foregoing description, such an illustration and description is to be considered as exemplary and not restrictive in character, it being understood that only illustrative embodiments have been shown and described and that all changes and modifications consistent with the disclosure and recited claims are desired to be protected.

The invention claimed is:

1. An all-spin logic device comprising:
   a first nanomagnet;
   a second nanomagnet; and
   a spin-coherent channel extending between the first and second nanomagnets, the spin-coherent channel configured to conduct a spin current from the first nanomagnet to the second nanomagnet to determine a state of the second nanomagnet in response to a state of the first nanomagnet.

2. The all-spin logic device of claim 1, wherein the first and second nanomagnets have identical switching characteristics.

3. The all-spin logic device of claim 1, further comprising a tunnel barrier disposed at an interface between the spin-coherent channel and one of the first and second nanomagnets.

4. The all-spin logic device of claim 1, wherein the second nanomagnet comprises:
   a free layer having an easy axis; and
   a fixed layer having an easy axis, the easy axis of the fixed layer being perpendicular to the easy axis of the free layer.

5. The all-spin logic device of claim 1, wherein the first and second nanomagnets are each electrically coupled to one un-clocked supply voltage.

6. The all-spin logic device of claim 5, wherein the second nanomagnet has a greater spin-torque conductance relative to the spin-coherent channel than the first nanomagnet.

7. The all-spin logic device of claim 5, wherein the spin-coherent channel comprises a ground terminal positioned closer to the first nanomagnet than to the second nanomagnet.

8. The all-spin logic device of claim 1, wherein the second nanomagnet is electrically coupled to a floating voltage.

9. The all-spin logic device of claim 1, wherein the second nanomagnet is grounded.

10. The all-spin logic device of claim 1, wherein the first and second nanomagnets each have an energy barrier of at least one-quarter electron-volt and each comprise less than $10^6$ Bohr magnetons.

11. An all-spin logic circuit comprising:
    a first nanomagnet having an input side and an output side;
    a second nanomagnet having an input side and an output side;
    a third nanomagnet having an input side and an output side;
    a first spin-coherent channel configured to conduct a spin current generated from the input side of the first nanomagnet to the output side of the second nanomagnet; and
    a second spin-coherent channel configured to conduct a spin current generated from the input side of the second nanomagnet to the output side of the third nanomagnet.

12. The all-spin logic circuit of claim 11, wherein the first, second, and third nanomagnets have identical switching characteristics.

13. The all-spin logic circuit of claim 11, further comprising a third spin-coherent channel configured to conduct a spin current generated from the input side of the third nanomagnet to the output side of the first nanomagnet.

14. The all-spin logic circuit of claim 11, wherein the output sides of the first, second, and third nanomagnets each have a greater spin-torque conductance than the input sides of the first, second, and third nanomagnets.

15. The all-spin logic circuit of claim 11, wherein:
    the first spin-coherent channel comprises a ground terminal positioned closer to the input side of the first nanomagnet than to the output side of the second nanomagnet; and
    the second spin-coherent channel comprises a ground terminal positioned closer to the input side of the second nanomagnet than to the output side of the third nanomagnet.

16. The all-spin logic circuit of claim 11, wherein the first and second spin-coherent channels are separated by an isolation layer.

17. The all-spin logic circuit of claim 11, wherein the first, second, and third nanomagnets are each electrically coupled to one un-clocked supply voltage.

18. A method comprising:
    applying a voltage to a first nanomagnet to generate a first spin current in response to a magnetization direction of the first nanomagnet; and
    routing the first spin current along a first spin-coherent channel to a second nanomagnet to determine a magnetization direction of the second nanomagnet.

19. The method of claim 18, wherein the magnetization direction of the second nanomagnet does not determine the magnetization direction of the first nanomagnet.

20. The method of claim 18, further comprising:
    applying a voltage to a third nanomagnet to generate a second spin current in response to a magnetization direction of the third nanomagnet; and
    routing the second spin current along the first spin-coherent channel to the second nanomagnet to determine the magnetization direction of the second nanomagnet in response to a superposition of the first and second spin currents.

21. The method of claim 18, further comprising:
applying a voltage to the second nanomagnet to generate a second spin current in response to the magnetization direction of the second nanomagnet; and
routing the second spin current along a second spin-coherent channel to a third nanomagnet to determine a magnetization direction of the third nanomagnet.

22. The method of claim 21, further comprising:
applying a voltage to the third nanomagnet to generate a third spin current in response to the magnetization direction of the third nanomagnet; and
routing the third spin current along a third spin-coherent channel to the first nanomagnet to determine the magnetization direction of the first nanomagnet.

23. The method of claim 21, wherein applying a voltage to the first nanomagnet and applying a voltage to the second nanomagnet comprise applying one un-clocked supply voltage to both the first and second nanomagnets.

24. The method of claim 18, further comprising applying a clocked supply voltage to a fixed layer of the second nanomagnet to place a free layer of the second nanomagnet in a neutral state while receiving the first spin current from the first spin-coherent channel.

25. The method of claim 18, further comprising applying a floating voltage to the second nanomagnet while receiving the first spin current from the first spin-coherent channel.

26. The method of claim 18, further comprising grounding the second nanomagnet while receiving the first spin current from the first spin-coherent channel.

27. The method of claim 26, wherein the magnetization direction of the second nanomagnet oscillates with the magnetization direction of the first nanomagnet.

* * * * *